United States Patent
Wetzel et al.

(10) Patent No.: US 7,115,993 B2
(45) Date of Patent: Oct. 3, 2006

(54) STRUCTURE COMPRISING AMORPHOUS CARBON FILM AND METHOD OF FORMING THEREOF

(75) Inventors: Jeffrey T. Wetzel, Austin, TX (US); David C. Wang, Austin, TX (US); Eric M. Lee, Austin, TX (US); Dorel Ioan Toma, Dripping Spring, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/766,872

(22) Filed: Jan. 30, 2004

(65) Prior Publication Data
US 2005/0167839 A1 Aug. 4, 2005

(51) Int. Cl.
*H01L 23/52* (2006.01)
(52) U.S. Cl. ............... 257/758; 257/760; 257/E21.232; 257/E21.27; 438/671
(58) Field of Classification Search ............... 257/758, 257/760, E21.232, E21.035, E21.27; 438/671
See application file for complete search history.

(56) References Cited

U.S. PATENT DOCUMENTS

| | | | |
|---|---|---|---|
| 6,316,167 B1 | 11/2001 | Angelopoulos et al. | |
| 6,573,030 B1 | 6/2003 | Fairbairn et al. | |
| 2003/0119307 A1* | 6/2003 | Bekiaris et al. | 438/638 |
| 2004/0082173 A1* | 4/2004 | Watatani | 438/689 |
| 2005/0056940 A1* | 3/2005 | Sandhu et al. | 257/770 |

* cited by examiner

*Primary Examiner*—Kenneth Parker
*Assistant Examiner*—Matthew E. Warren
(74) *Attorney, Agent, or Firm*—Oblon, Spivak, McClelland, Maier & Neustadt, P.C.

(57) ABSTRACT

A semiconductor device includes a semiconductor substrate, a film stack formed on the semiconductor substrate and having a film to be processed. A dual hard mask included in the film stack has an amorphous carbon layer and an underlying hard mask layer interposed between the amorphous carbon layer and the film to be processed, the hard mask layer does not include an amorphous carbon layer. A damascene structure for a metal interconnect is formed in the film stack. The amorphous carbon film can, for example, be incorporated within a single damascene structure, or a dual damascene structure. The amorphous carbon film can serve as part of a lithographic mask for forming the interconnect structure, or it may serve as a top layer of a dual hard mask, a chemical mechanical polishing (CMP) stop layer, or a sacrificial layer during CMP.

17 Claims, 22 Drawing Sheets

STRUCTURE COMPRISING AMORPHOUS CARBON FILM AND METHOD OF FORMING THEREOF

BACKGROUND OF THE INVENTION

1. Field of the Invention

The present invention relates to a structure comprising an anti-reflective coating (ARC) and a method of forming the structure and, more particularly, to a back-end of line (BEOL) structure comprising an amorphous carbon ARC layer and a method of forming the structure.

2. Description of Related Art

In material processing methodologies, pattern etching comprises the application of a patterned mask of radiation-sensitive material, such as photoresist, to a thin film on an upper surface of a substrate, and transferring the mask pattern to the underlying thin film by etching. The patterning of the radiation-sensitive material generally involves coating an upper surface of the substrate with a thin film of radiation-sensitive material and then exposing the thin film of radiation-sensitive material to a radiation source through a reticle (and associated optics) using, for example, a photo-lithography system. Then a developing process is performed, during which the removal of the irradiated regions of the radiation-sensitive material occurs (as in the case of positive photoresist), or the removal of non-irradiated regions occurs (as in the case of negative resist) using a base developing solution, or solvent. The remaining radiation-sensitive material exposes the underlying substrate surface in a pattern that is ready to be etched into the surface. Photolithographic systems for performing the above-described material processing methodologies have become a mainstay of semiconductor device patterning for the last three decades, and are expected to continue in that role down to 65 nm resolution, and less.

The resolution ($r_o$) of a photolithographic system determines the minimum size of devices that can be made using the system. Having a given lithographic constant $k_1$, the resolution is given by the equation $$r_o = k_1 \lambda / NA, \quad (1)$$

where $\lambda$ is the operational wavelength, and NA is the numerical aperture given by the equation $$NA = n \cdot \sin \theta_o. \quad (2)$$

Angle $\theta_o$ is the angular semi-aperture of the system, and n is the index of refraction of the material filling the space between the system and the substrate to be patterned.

Therefore, current lithographic trends involve increasing the numerical aperture (NA) in order to print smaller and smaller structures. However, although the increased NA permits greater resolution, the depth of focus for the images projected into the light-sensitive material is reduced, leading to thinner mask layers. As the light-sensitive layer thickness decreases, the patterned light-sensitive layer becomes less effective as a mask for pattern etching, i.e., most of the (light-sensitive) mask layer is consumed during etching. Without a dramatic improvement in etch selectivity, single layer masks have become deficient in providing the necessary lithographic and etch characteristics suitable for high resolution lithography.

An additional shortcoming of single layer masks is the control of critical dimension (CD). Substrate reflections at ultraviolet (UV) and deep ultraviolet (DUV) wavelengths are known to cause standing waves in the light-sensitive layer due to thin film interference. This interference manifests as periodic variations in light intensity in the light-sensitive layer during exposure resulting in vertically spaced striations in the light-sensitive layer and loss of CD.

In order to counter the effects of standing waves in the light-sensitive layer as well as provide a thicker mask for subsequent pattern etch transfer, a bilayer or multilayer mask can be formed that incorporates a bottom anti-reflective coating (BARC). The BARC layer comprises a thin absorbing film to reduce thin film interference; however, the BARC layer can still suffer from several limitations including poor thickness uniformity due in part to spin-on deposition techniques.

Alternatively, vapor deposited thin film ARC layers that offer the ability to tune the optical properties of the film have been proposed to alleviate many of the above-identified problems. For example, organosilicate films, such as tunable etch resistant ARC (TERA) layers (see U.S. Pat. No. 6,316,167, assigned to International Business Machines Corporation), and amorphous carbon films (U.S. Pat. No. 6,573,030, assigned to Applied Materials, Inc.) can be produced having a tunable index of refraction and extinction coefficient which can be optionally graded along the film thickness to match the optical properties of the substrate with the imaging light-sensitive layer. With regard to the use of amorphous carbon films, however, the present inventors have recognized that the disclosure of such films in (U.S. Pat. No. 6,573,030 is not ideally suited for the formation of a damascene structure.

SUMMARY OF THE INVENTION

One aspect of the present invention is to reduce or eliminate any or all of the above-described problems.

Another object of the present invention is to provide a structure incorporating an amorphous carbon layer, and a method of forming the same.

Yet another object of the present invention is to provide a damascene structure that effectively incorporates an amorphous carbon layer.

In one aspect of the invention, a semiconductor device includes a semiconductor substrate, a film stack formed on the semiconductor substrate and having a film to be processed. A dual hard mask included in the film stack has an amorphous carbon layer and an underlying hard mask layer interposed between the amorphous carbon layer and the film to be processed, the hard mask layer does not include an amorphous carbon layer. A damascene structure for a metal interconnect is formed in the film stack. According to another aspect, a process for forming an integrated circuit structure includes forming a layer of dielectric material on a substrate, forming a hard mask layer on the layer of dielectric material and forming a layer of amorphous carbon material on the hard mask layer. A damascene structure for a metal interconnect is formed by using the layer of amorphous carbon material as a lithographic structure for the formation of the interconnect structure, a top layer of a dual hard mask, and an anti-reflective coating, and as a sacrificial layer in a chemical mechanical polishing (CMP) process, wherein the hard mask is used as a CMP stop layer.

DETAILED DESCRIPTION OF EXEMPLARY EMBODIMENTS

Figure 1A:
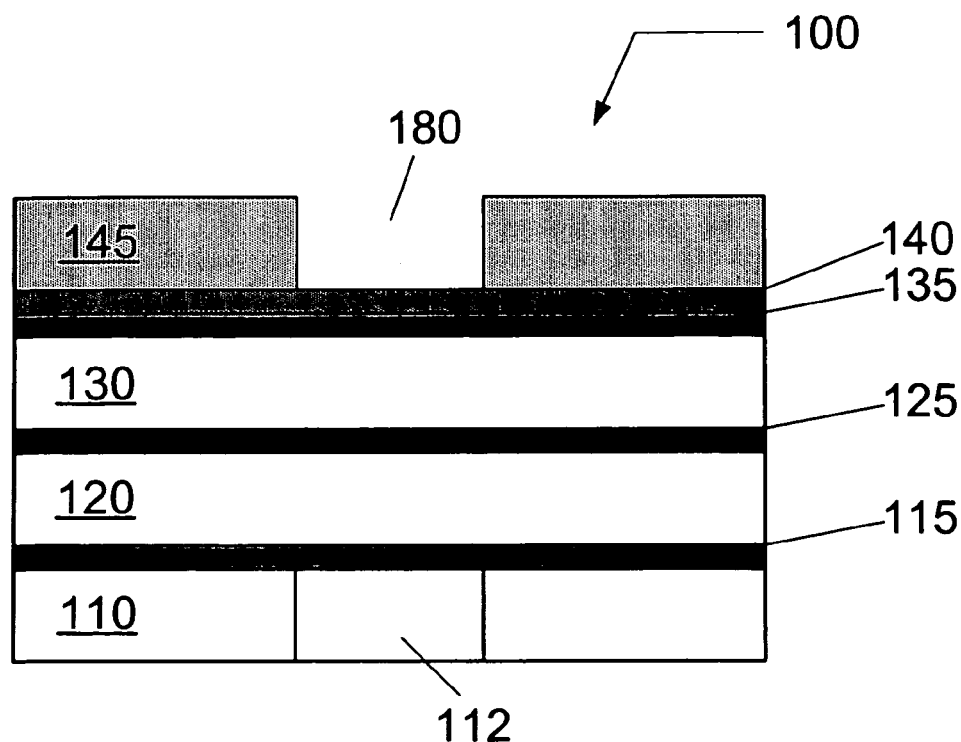
FIGS. 1A through 1H present a simplified schematic representation of a method of forming an interconnect structure in accordance with an embodiment of the present invention.

As noted above, the present inventors have recognized that the disclosure of amorphous carbon films in U.S. Pat. No. 6,573,030 is not ideally suited for the formation of a damascene structure. Specifically, the embodiments of FIGS. 2 and 3 of the U.S. Pat. No. 6,573,030 disclose the amorphous carbon layer used as a hard mask placed in direct contact with the film to be processed. While FIG. 4 of the U.S. Pat. No. 6,573,030 discloses the amorphous carbon layer as an antireflective coating and FIG. 5 shows two amorphous carbon layers combined to provide a hard mask and an antireflective coating, these embodiments also require the amorphous carbon layer in direct contact with the film to be processed. The present inventors have recognized that in a damascene structure amorphous carbon films are useful not only as a tunable ARC layer and hard mask, but also as a removable etch hard mask in a dual hard mask configuration and as a sacrificial layer in a chemical-mechanical polishing (CMP) process where the layer underlying the amorphous carbon layer serves as a stop layer. Thus, according to the present invention, at least one amorphous carbon layer is integrated with a back end of line (BEOL) application, such as within a single damascene or dual damascene metal interconnect structure formed in a film stack, wherein at least one amorphous carbon layer provides at least one of a lithographic structure for the formation of the interconnect structure, a top layer of a dual hard mask, an anti-reflective coating, a sacrificial layer in a chemical mechanical polishing (CMP) step, or a (CMP) stop layer for a sacrificial layer provided on top of the amorphous carbon layer.

Referring now to the drawings, wherein like reference numerals designate identical or corresponding parts throughout the several views, FIGS. 1A through 1H present a schematic representation of a method of forming an interconnect structure in a film stack according to one embodiment. The method can be characterized as the integration of an amorphous carbon layer into a multiple hard mask via first dual damascene structure. The term "via-first", as used herein, refers to a process wherein an etch relating to formation of the via occurs before an etch relating to the formation of another feature such as a trench.

As shown in FIG. 1A, the method begins with preparing a film stack 100 comprising a substrate 110 having a metal line 112 formed therein, a metal cap layer 115 formed on the substrate 110, a first dielectric layer 120 formed on the metal cap layer 115, an etch stop layer 125 formed on the first dielectric layer 120, a second dielectric layer 130 formed on the etch stop layer 125, a hard mask layer 135 formed on the second dielectric layer 130, an amorphous carbon layer 140 formed on the hard mask layer 135, and a layer of light-sensitive material 145 formed on the amorphous carbon layer 140.

The hard mask layer 135 interposed between the amorphous carbon layer and the film to be processed can provide a lower hard mask used with the amorphous carbon layer 140 as a top hard mask. This provides a thicker mask needed for the greater mask consumption that accompanies deep etching into the film to be processed, for example. The hard mask layer 135 interposed between amorphous carbon layer and the film to be processed can also provide a CMP stop layer in a dual damascene structure when the amorphous carbon layer is used as a sacrificial layer. Such a CMP process is particularly useful in dual damascene processes wherein a copper metallization is polished after being filled into the damascene structure. Additionally, for example, hard mask layer 135 can facilitate the use of etch processes having greater etch selectivity (between the material to be processed and the hard mask material), thereby maintaining the critical dimension (CD) by reducing faceting.

The utilization of the amorphous carbon layer 140 as the layer in contact with the light-sensitive material 145 of the film stack 100 can facilitate control of the critical dimension (CD) of the interconnect structure, or control of CD variation within the interconnect structure (due to, for example, line edge roughness in the layer of light-sensitive layer 145). The formation of the film stack 100 can comprise steps, and utilize techniques known to those skilled in the art of preparing such (insulating) film stacks for inter-level, and intra-level, (metal) interconnect structures, such as single damascene and dual damascene structures.

For example, the metal line 112 can comprise tungsten, aluminum, or copper. Additionally, for example, the metal cap layer 115 can comprise a nitride or carbide material, such as silicon nitride ($Si_3N_4$) or silicon carbide (SiC) or silicon carbonitride (SiCN) or silicon oxycarbonitride (SiCON), or combinations thereof, or other films suitable as a metal diffusion barrier. This layer can be formed using methods including but not limited to chemical vapor deposition (CVD), or plasma enhanced CVD (PECVD). Additionally, for example, the etch stop layer 125, which can be an optional layer (as will be described later), can comprise a nitride material, such as silicon nitride ($Si_3N_4$), a carbide material, such as silicon carbide (SiC) or silicon oxycarbide (SiCO), or an oxide material such as silicon dioxide ($SiO_2$), or combinations thereof. This layer can be formed using methods including but not limited to chemical vapor deposition (CVD), or plasma enhanced CVD (PECVD).

The first dielectric layer 120 and the second dielectric layer 130 can comprise the same material composition, or different material composition. Each dielectric layer can, for example, comprise silicon dioxide, or a dielectric material having a nominal dielectric constant value less than the dielectric constant of $SiO_2$, which is approximately 4 (e.g., the dielectric constant for thermal silicon dioxide can range from 3.8 to 3.9). More specifically, the first and second dielectric layers 120, 130 may have a dielectric constant of less than 3.7, or a dielectric constant ranging from 1.6 to 3.7.

Each dielectric layer 120, 130 can be formed using chemical vapor deposition (CVD) or plasma enhanced chemical vapor deposition (PECVD) techniques, or spin-on dielectric (SOD) techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. The track system can be configured for processing substrate sizes of 100 mm, 200 mm, 300 mm, and greater. Other systems and methods for forming a dielectric film on a substrate are well known to those skilled in the art of both spin-on dielectric technology and CVD dielectric technology.

Furthermore, the first and second dielectric layers 120, 130 may, for example, be characterized as low dielectric constant (or low-k) dielectric films. These dielectric layers may include at least one of an organic, inorganic, and inorganic-organic hybrid material. Additionally, these dielectric layers may be porous or non-porous. For example, these dielectric layers may include an inorganic, silicate-based material, such as carbon doped silicon oxide (or organo siloxane), deposited using CVD techniques. Examples of such films include Black Diamond™ CVD organosilicate glass (OSG) films commercially available from Applied Materials, Inc., or Coral™ CVD films commercially available from Novellus Systems. Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process. Still alternatively, these dielectric layers may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, these dielectric layers can comprise an organic material deposited using SOD techniques. Examples of such films include SiLK-I, SiLK-J, SiLK-H, SiLK-D, and porous SiLK semiconductor dielectric resins commercially available from Dow Chemical, and GX-3P™, and GX-3™ semiconductor dielectric resins commercially available from Honeywell.

Additionally, for example, the hard mask layer 135 can comprise a nitride, such as silicon nitride ($Si_3N_4$), a carbide, such as silicon carbide (SiC) or silicon oxycarbide (SiCO), or a refractory metal or refractory metal nitride such as tantalum nitride (TaN), or combinations thereof. This layer may be formed employing methods including but not limited to chemical vapor deposition (CVD) methods, plasma enhanced chemical vapor deposition (PECVD) methods and physical vapor deposition (PVD) sputtering methods.

The amorphous carbon layer 140 can, for example, be formed by thermally decomposing a gas mixture comprising a hydrocarbon compound and an inert gas. The gas mixture, which may optionally include an additive gas, is introduced into a process chamber where plasma enhanced thermal decomposition of the hydrocarbon compound in close proximity to a substrate surface, results in deposition of an amorphous carbon layer 140 on the substrate surface. An as-deposited amorphous carbon layer 140, deposited according to the process of the invention, has an adjustable carbon:hydrogen ratio that ranges from about 10% hydrogen to about 60% hydrogen. The amorphous carbon layer 140 also has an extinction coefficient that can be varied between about 0.1 to about 1.0 at wavelengths below about 250 nm, making it suitable for use as an anti-reflective coating (ARC) at DUV wavelengths. Moreover, the amorphous carbon film 140 can be fabricated to demonstrate an optical range for index of refraction of approximately 1.50<n<1.90. Additional details are provided in U.S. Pat. No. 6,573,030, entitled "Method for depositing an amorphous carbon layer", assigned to Applied Materials, Inc.; the entire contents of which are incorporated herein in their entirety. The optical properties of the amorphous carbon film 140, such as the index of refraction, can be selected so as to substantially match the optical properties of the underlying layer, or layers, as well as the overlying layer, or layers. For example, underlying layers such as non-porous dielectric films can require achieving an index of refraction in the range of 1.5<n<1.9; and underlying layers such as porous dielectric films can require achieving an index of refraction in the range of 1.2<n<2.6.

Additionally, for example, the layer of light-sensitive material 145 can comprise photoresist, wherein a pattern can be formed therein using micro-lithography, followed by the removal of the irradiated regions of the light-sensitive material (as in the case of positive photoresist), or non-irradiated regions (as in the case of negative resist) using a developing solvent. For example, the layer (or layers) of light-sensitive material 145 can be formed using a track system. The track system can be configured for processing 248 nm resists, 193 nm resists, 157 nm resists, EUV resists, (top/bottom) anti-reflective coatings (TARC/BARC), and top coats. For example, the track system can comprise a Clean Track ACT 8, or ACT 12 resist coating and developing system commercially available from Tokyo Electron Limited (TEL). Other systems and methods for forming a photoresist film on a substrate are well known to those skilled in the art of spin-on resist technology. Additionally, for example, the mask pattern can be formed using any suitable conventional stepping lithographic system, or scanning lithographic system.

Figure 1B:
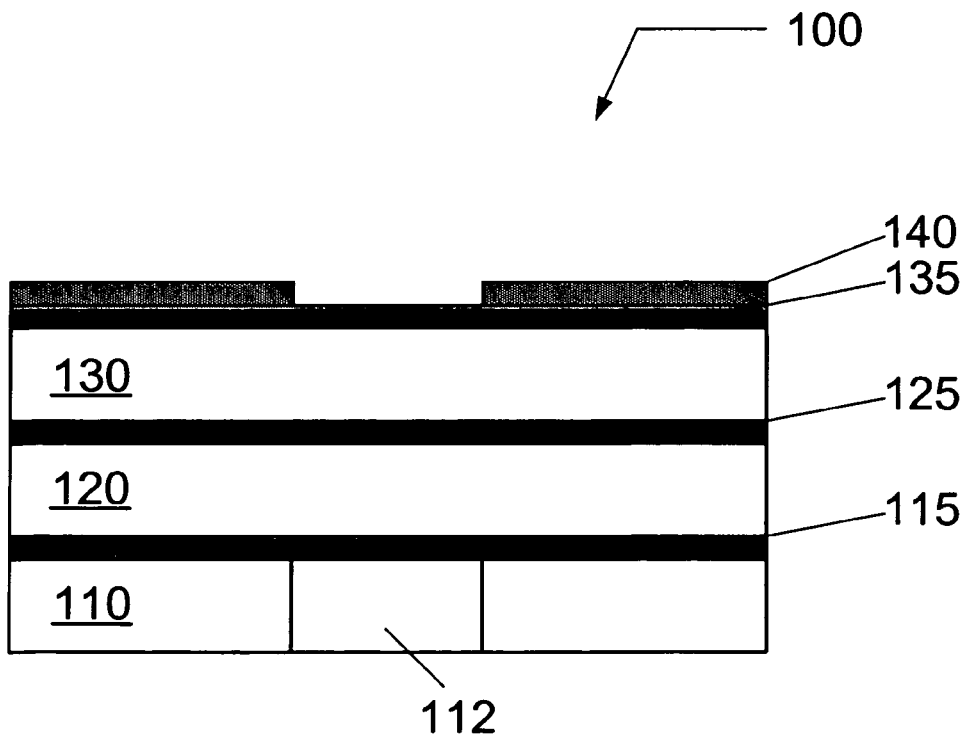

Once the layer of light-sensitive material 145 is formed on film stack 100, it can be patterned with a first pattern 180 using micro-lithography, as described above. The first pattern 180 can, for example, comprise a pattern for a via, or contact. As shown in FIG. 1B, the first pattern 180 can be transferred to the amorphous carbon layer of the dual hard mask using, for example, dry plasma etching. The dry plasma etch process can comprise a plasma chemistry containing at least one of the species selected from the group consisting of oxygen, fluorine, chlorine, bromine, hydrogen, and combinations thereof. Alternatively, the plasma chemistry can further comprise nitrogen or an inert gas, such as a Noble gas (i.e., helium, neon, argon, xenon, krypton, radon). Still alternatively, the plasma chemistry is chosen to exhibit high etch selectivity between the etch rate of the amorphous carbon layer and the etch rate of the overlying patterned layer of light-sensitive material. Still alternatively, the plasma chemistry is chosen to exhibit high etch selectivity between the etch rate of the amorphous carbon layer and the etch rate of the underlying hard mask layer. Once the first pattern 180 is transferred to the amorphous carbon layer 140, the patterned amorphous carbon layer 140 can be utilized as a top hard mask, when utilized with the hard mask stop layer 135, for etching the underlying film stack. The remaining light-sensitive material 145 is then removed using plasma or other chemical techniques known to those skilled in the art.

Figure 1C:
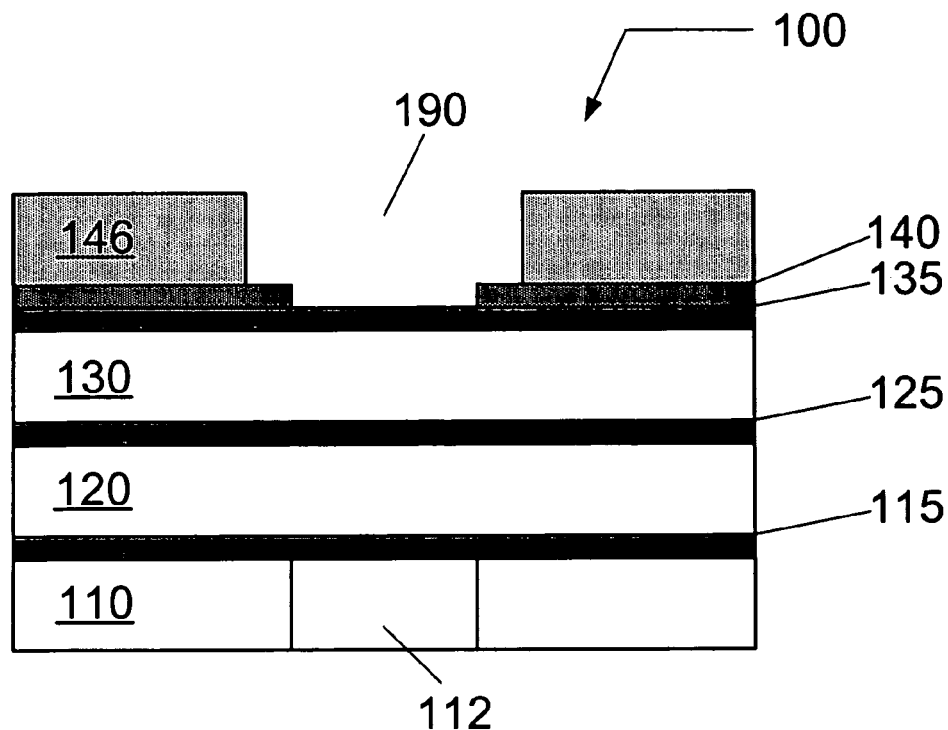
Figure 1D:
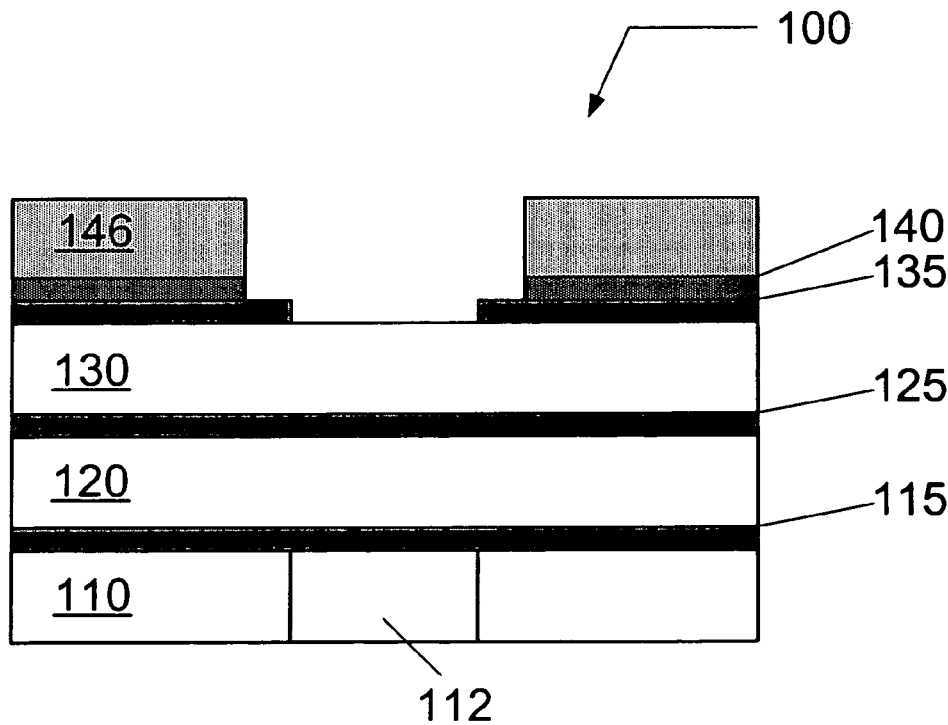

Referring now to FIG. 1C, another layer of light-sensitive material 146 is formed on film stack 100 using techniques described above. Therein, a second pattern 190 is formed using micro-lithography. The second pattern 190 can, for example, comprise a trench pattern. Once the second pattern 190 is formed in the layer of light-sensitive material 146, the second pattern 190 is transferred to the amorphous carbon layer 140, and the first pattern 180 is transferred to the hard mask layer 135, as shown in FIG. 1D. For example, the transfer of the second pattern and the first pattern to the amorphous carbon layer and the hard mask layer, respectively, can be performed simultaneously.

Figure 1E:
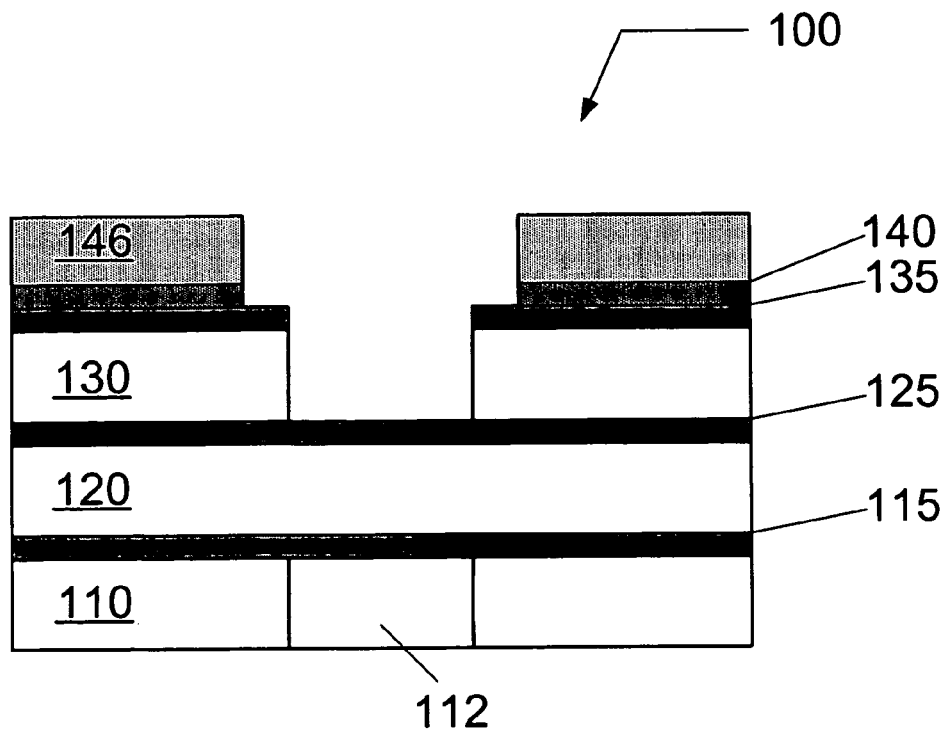

Following the pattern transfers to the amorphous carbon layer 140 and the hard mask layer 135, FIG. 1E illustrates the transfer of the first pattern 180 to the second dielectric layer 130. Because the intermediate via etch step of FIG. 1E is stopped at the etch stop layer 125, the structure of FIG. 1E is referred to herein as a partial via structure. The transfer of the first pattern 180 to the second dielectric layer 130 can comprise dry plasma etching, wherein the process is designed to stop on the underlying etch stop layer 125.

For instance, when etching oxide dielectric films such as silicon oxide, silicon dioxide, etc., or when etching inorganic low-k dielectric films such as carbon doped silicon oxide materials, the etch gas composition generally includes a fluorocarbon-based chemistry such as at least one of $C_4F_8$, $C_5F_8$, $C_3F_6$, $C_4F_6$, $CF_4$, etc., and at least one of an inert gas, oxygen, or CO. Additionally, for example, when etching organic low-k dielectric films, the etch gas composition may include at least one of a fluorocarbon gas, a nitrogen-containing gas, a hydrogen-containing gas, or an oxygen-containing gas. The techniques for selectively etching a dielectric film, such as those described earlier, are well known to those skilled in the art of dielectric etch processes. The plasma chemistry can be chosen to exhibit a high selectivity for etching the second dielectric layer 130 relative to the etch stop layer 125. The etching processes can be chosen to exhibit any one of profile and critical dimension (CD) control, etch uniformity (across the substrate), a flat etch front in order to avoid micro-trenching, etch selectivity to the layer of light-sensitive material, and etch selectivity to the CMP stop layer and the etch stop layer.

Figure 1F:
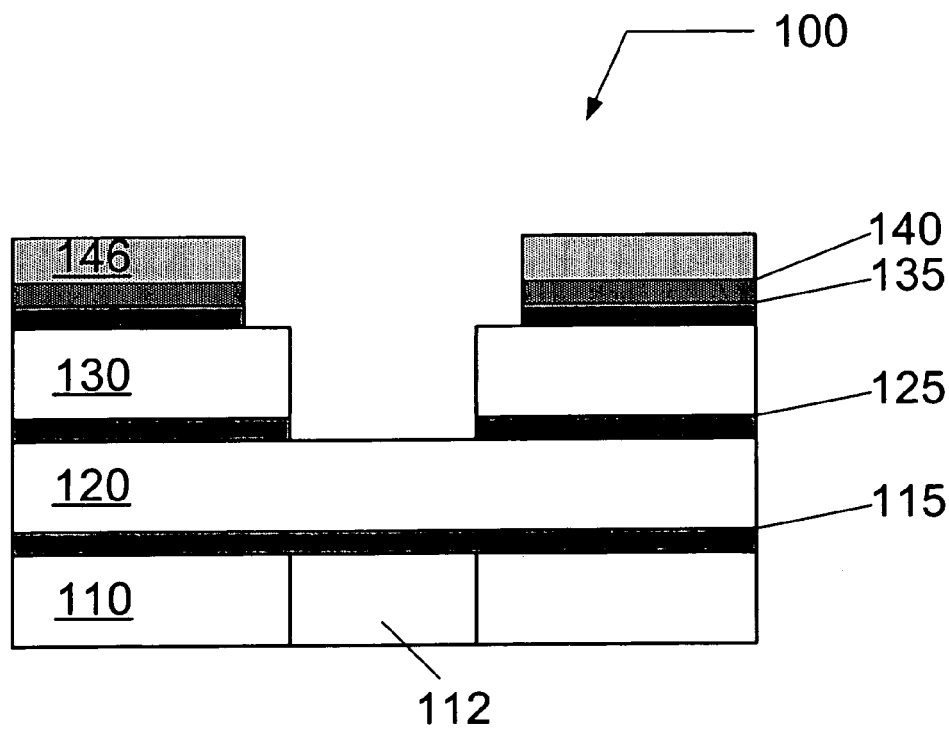

Referring now to FIG. 1F, the first pattern 180 is transferred to the etch stop layer 125, and the second pattern 190 is transferred to the hard mask layer 135. For example, the transfer of the first pattern and the second pattern to the etch stop layer and the hard mask layer, respectively, can be performed simultaneously. The pattern transfer can utilize dry plasma etching, wherein the plasma chemistry comprises at least one of $NF_3$, $SF_6$, HBr, a fluorocarbon gas, a hydrofluorocarbon gas, or an oxygen-containing gas. The etching processes can be chosen to exhibit any one of profile and critical dimension (CD) control, etch selectivity to the layer of light-sensitive material, etch uniformity (across the substrate), and complete hard mask layer and etch stop layer removal.

Figure 1G:
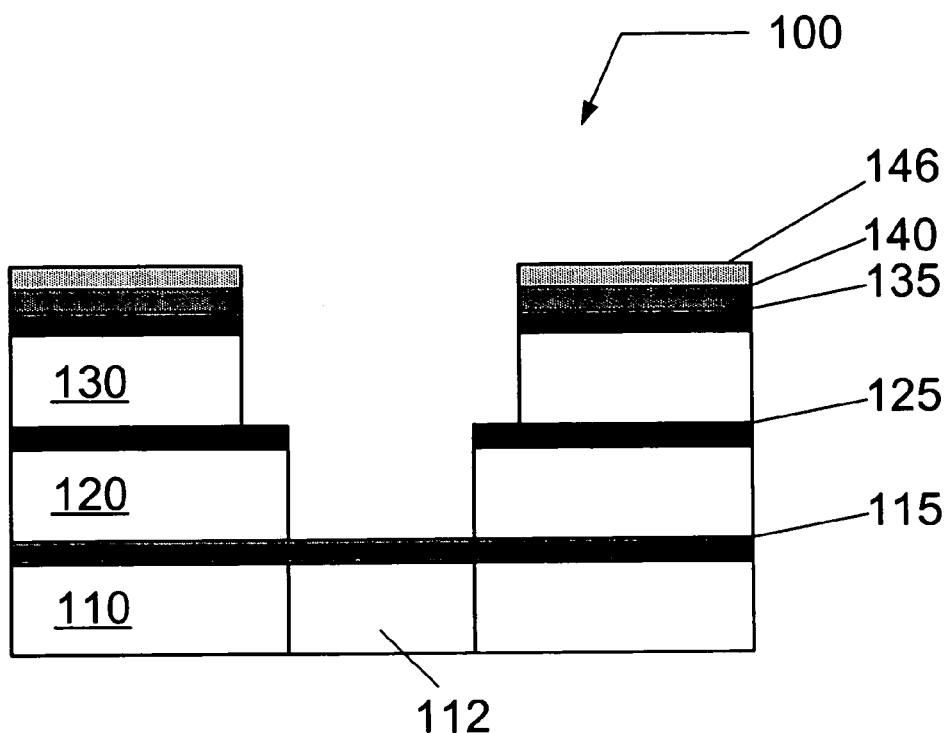

In FIG. 1G, the second pattern 190 is transferred to the second dielectric layer 130, and the first pattern 180 is transferred to the first dielectric layer 120. For example, the transfer of the second pattern and the first pattern to the second dielectric layer and the first dielectric layer, respectively, can be performed simultaneously, wherein the etching process for the second dielectric layer stops on the etch stop layer 125, and the etching process for the first dielectric layer stops on the metal cap layer 115. The etching processes can comprise dry plasma etching, utilizing plasma chemistries such as those described above for dielectric layers. The etching processes can be chosen to exhibit any one of profile and critical dimension (CD) control, etch uniformity (across the substrate), a flat etch front in order to avoid micro-trenching, and first pattern/second pattern corner selectivity. Any remaining light-sensitive material 146 may then be removed using plasma or other chemical techniques known to those skilled in the art.

Figure 1H:
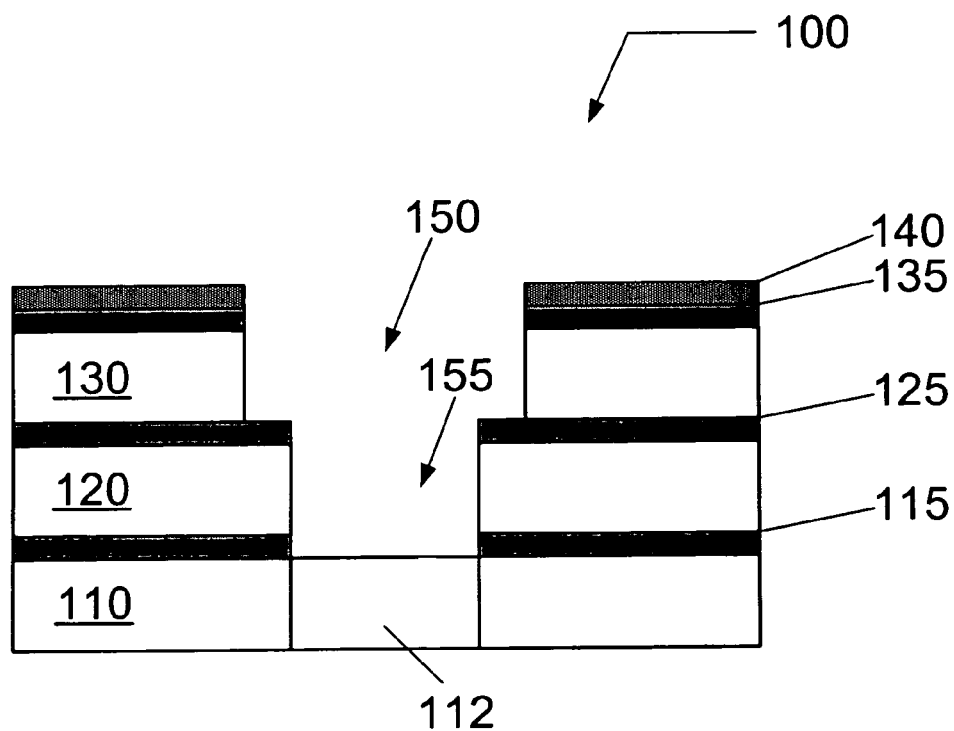

Thereafter, as shown in FIG. 1H, the first pattern 180 is transferred to the metal cap layer 115, hence, completing the formation of, for example, a via structure 155 and a trench structure 150. In one embodiment, the via structure 155 and trench structure 150 are simultaneously filled with metal such as copper. In this embodiment, the amorphous carbon layer 140 can serve as a sacrificial layer and the hard mask layer 135 can serve as a CMP stop layer in a CMP process of planarizing the copper.

According to another embodiment, FIGS. 2A through 2F present a schematic representation of a method of forming an interconnect structure in a film stack 200. The method can be characterized as the integration of an amorphous carbon layer into a full via first dual damascene structure. As used herein, the term "full-via-first" refers to a process wherein an etch relating to full formation of the via occurs before an etch relating to the formation of another feature such as a trench. The film stack 200 comprises a substrate 210 having a metal line 212 formed therein, a metal cap layer 215 formed on the substrate 210, a first dielectric layer 220 formed on the metal cap layer 215, an etch stop layer 225 formed on the first dielectric layer 220, a second dielectric layer 230 formed on the etch stop layer 225, a hard mask layer 235 formed on the second dielectric layer 230, an amorphous carbon layer 240 formed on the hard mask layer 235, and a layer of light-sensitive material 245 formed on the amorphous carbon layer 240, and it can be prepared in much the same manner as the film stack 100 described in FIG. 1A. The hard mask layer 235 interposed between the second dielectric layer 230 and the amorphous carbon layer 240 can provide at least one of a bottom layer of a dual hard mask, and a CMP stop layer. The amorphous carbon layer 240 can provide at least one of a top hard mask, a tunable ARC layer, a CMP stop layer, and a sacrificial layer when the hard mask layer 235 is utilized as CMP stop layer in a dual damascene structure.

Figure 2A:
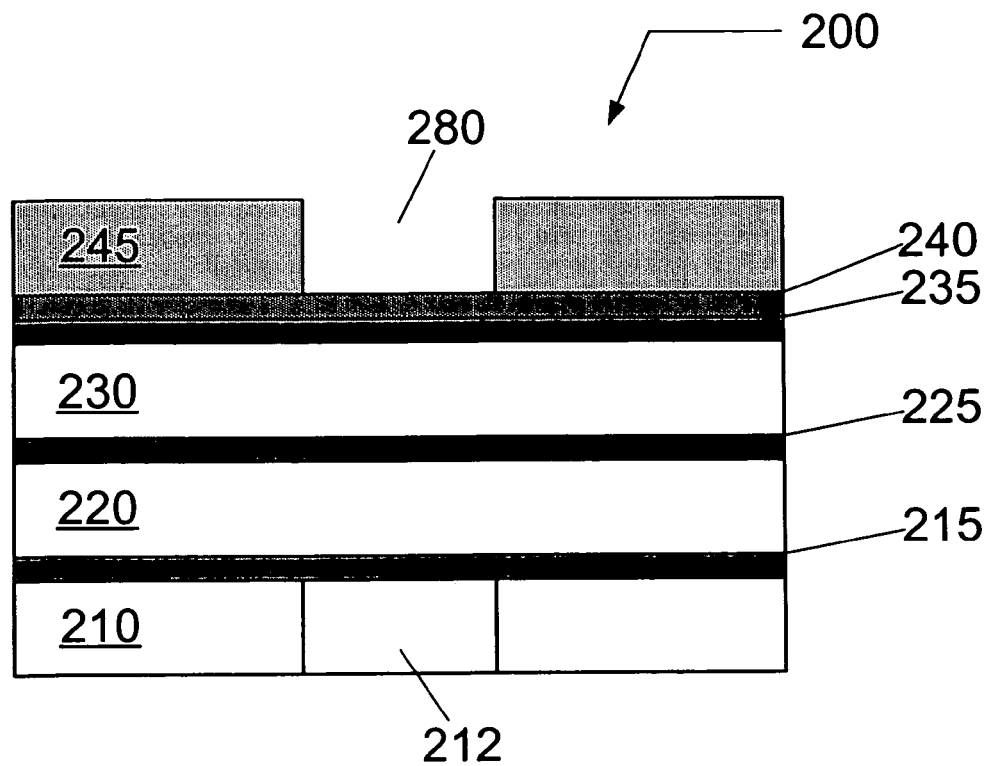
FIGS. 2A through 2F present a simplified schematic representation of a method of forming an interconnect structure in accordance with another embodiment of the present invention.
Figure 2B:
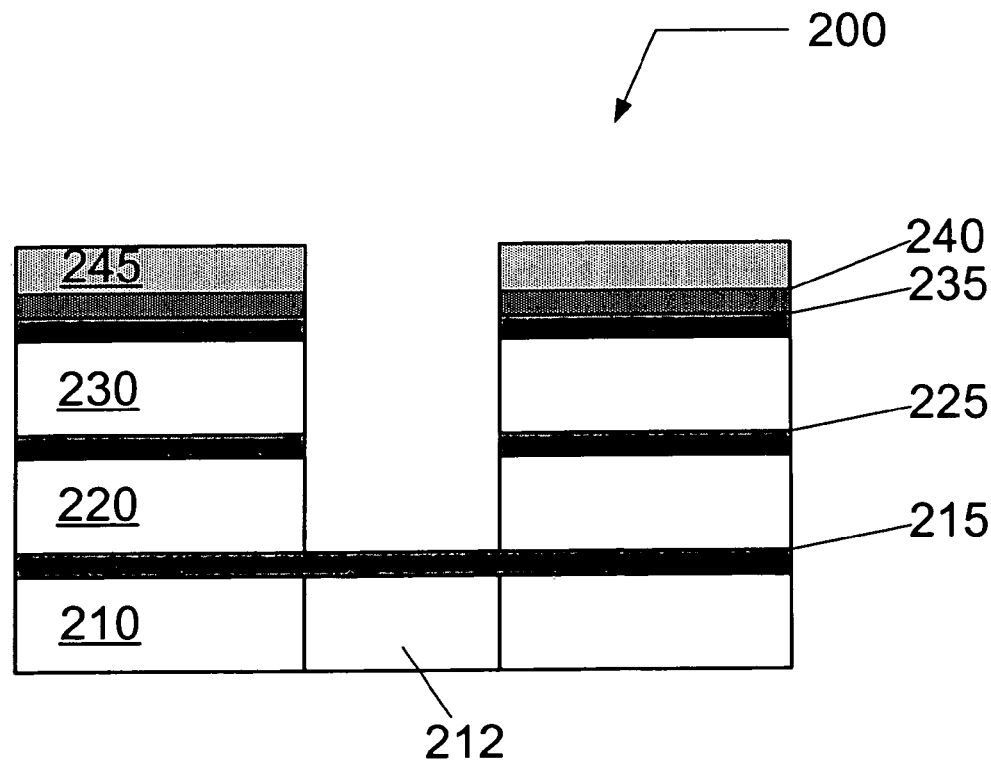

Once the layer of light-sensitive material 245 is formed on film stack 200, it can be patterned with a first pattern 280 using micro-lithography, as described above. The first pattern 280 can, for example, comprise a pattern for a via, or contact. As shown in FIG. 2B, the first pattern 280 can be transferred to the amorphous carbon layer 240, the hard mask layer 235, the second dielectric layer 230, the etch stop layer 225, and the first dielectric layer 220 using, for example, dry plasma etching. The etching process for each layer can comprise steps, and chemistries similar to those described above. Because the intermediate via etch step of FIG. 2B is stopped at the metal cap layer 215, the structure of FIG. 2B is referred to herein as a full via structure. Any remaining light-sensitive material 245 is then removed using plasma or other chemical techniques known to those skilled in the art.

Figure 2C:
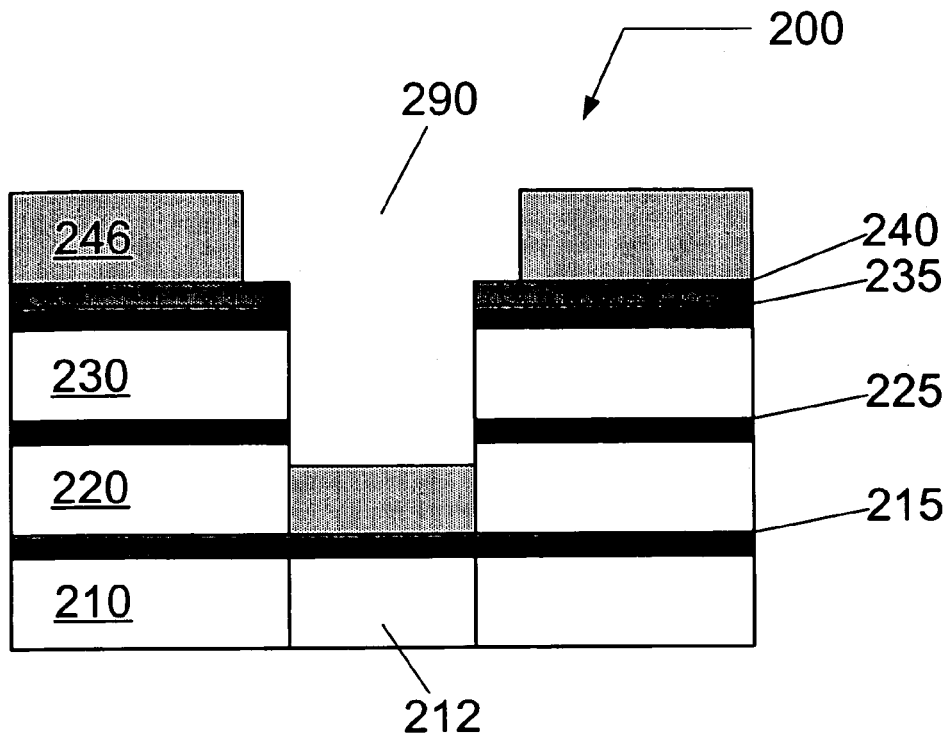
Figure 2D:
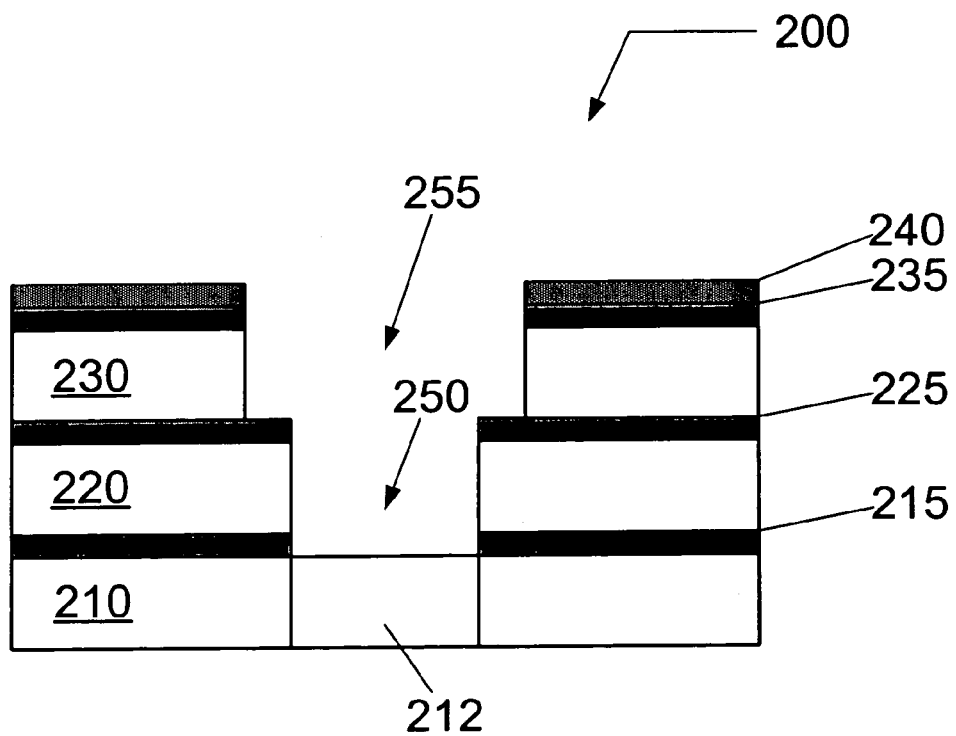

Referring now to FIG. 2C, another layer of light-sensitive material 246 is formed on film stack 200 using techniques described above. Therein, a second pattern 290 is formed using micro-lithography. The second pattern 290 can, for example, comprise a trench pattern. Once the second pattern 290 is formed in the layer of light-sensitive material 246, the second pattern 290 is transferred to the amorphous carbon layer 240, the hard mask layer 235, and the second dielectric layer 230. Any remaining light-sensitive material 246 is then removed using plasma or other chemical techniques known to those skilled in the art. Thereafter, as shown in FIG. 2D, the first pattern 280 is transferred to the metal cap layer 215, hence, completing the formation of, for example, a via structure 250 and a trench structure 255.

Figure 2E:
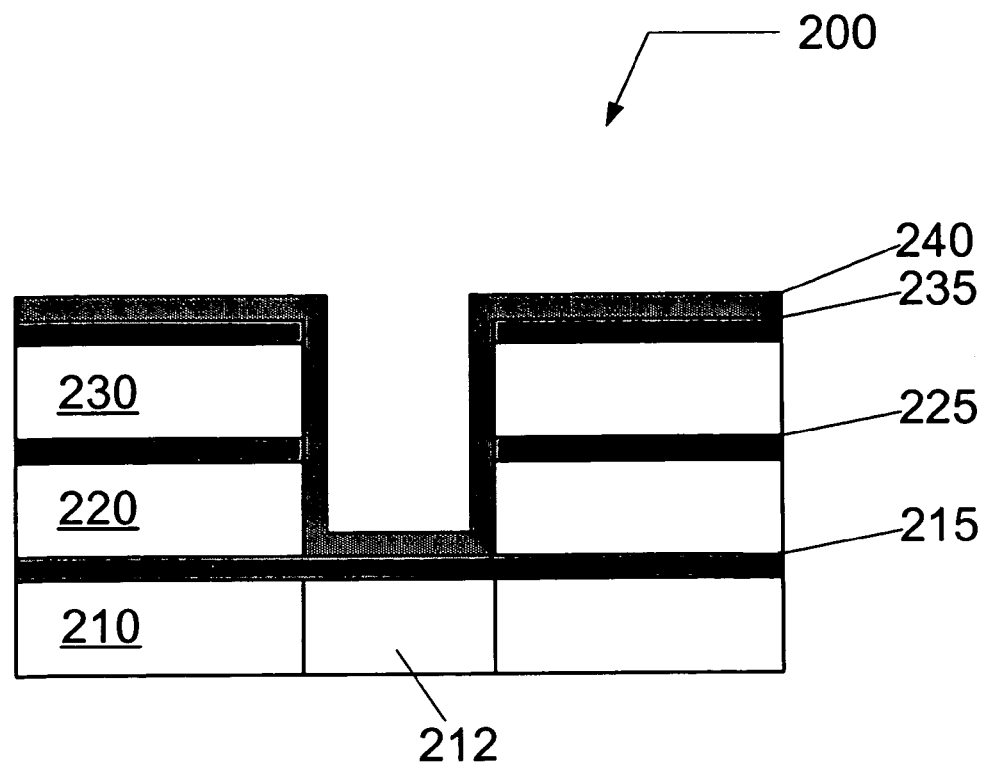
Figure 2F:
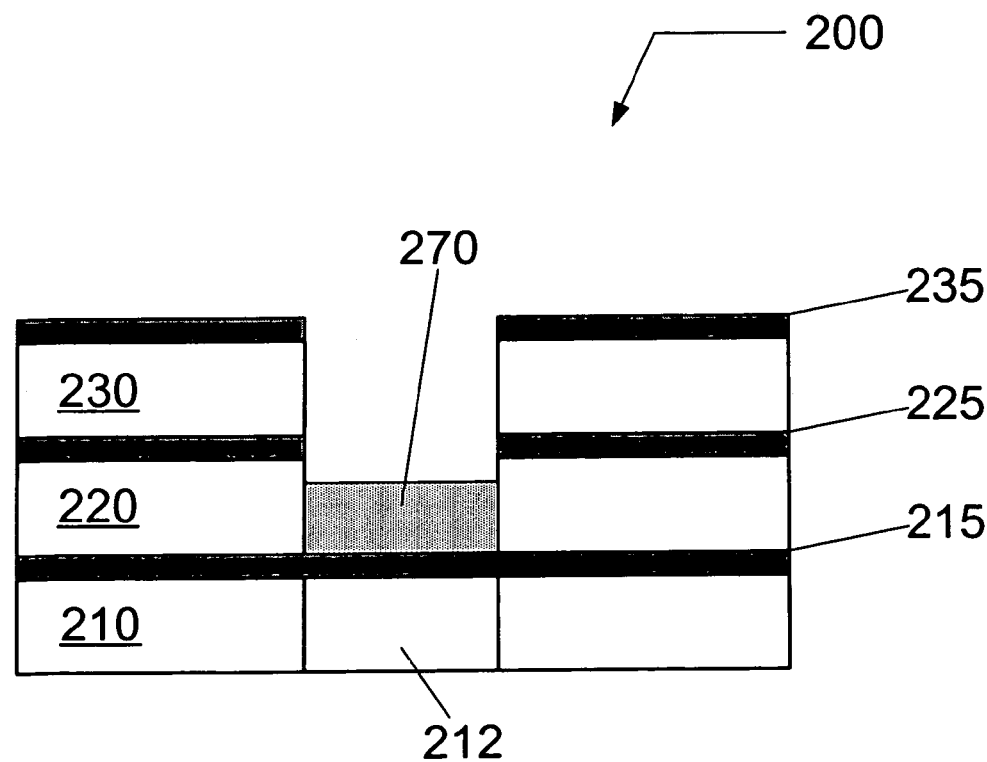

It is possible that during the removal of the light-sensitive layer 245 following the pattern transfer of the first pattern 280, the ashing (or stripping) process can affect the properties of amorphous carbon layer 240. Therefore, in one embodiment of the present invention, the amorphous carbon layer 240 can be removed and re-deposited as shown in FIG. 2E. In this embodiment, the hard mask 235 can serve as an etch stop layer or CMP stop layer to prevent damage to the dielectric layer 230. Thereafter, the pattern transfer of the second pattern 290 can be performed as shown in FIGS. 2C and 2D. However, during this etching process, the amorphous carbon layer 240 may or may not be entirely removed from the exposed sidewalls of the first dielectric film 220. Therefore, in an alternate embodiment, as shown in FIG. 2F, the amorphous carbon layer 240 is removed following the first pattern transfer, and a BARC layer material 270 is applied using, for example, spin coating techniques. The BARC layer material 270 filling via structure 250 may then be partially removed or recessed using a dry plasma etch. The etch gas composition may include at least one of a fluorocarbon gas, a nitrogen-containing gas, a hydrogen-containing gas, or an oxygen-containing gas. Thereafter, the pattern transfer of the second pattern 290 can be performed using standard techniques known to those skilled in the art to form the trench structure 255. In one embodiment, the via structure 250 and trench structure 255 are simultaneously filled with metal such as copper. In this embodiment, the amorphous carbon layer 240 can serve as a sacrificial layer and the hard mask layer 235 can serve as a CMP stop layer in a CMP process of planarizing the copper.

According to another embodiment, FIGS. 3A through 3F present a schematic representation of a method of forming an interconnect structure in a film stack 300. The method can be characterized as the integration of an amorphous carbon layer into a full via first dual damascene structure without a stop layer. The film stack 300 comprises a substrate 310 having a metal line 312 formed therein, a metal cap layer 315 formed on the substrate 310, a dielectric layer 320 formed on the metal cap layer 315, a hard mask layer 335 formed on the dielectric layer 320, an amorphous carbon layer 340 formed on the hard mask layer 335, and a layer of light-sensitive material 345 formed on the amorphous carbon layer 340, and each layer in film stack 300 can be prepared in much the same manner as the film stack 100 described in FIG. 1A. Herein, the hard mask layer 335 can provide a lower layer in a dual hard mask structure or a CMP stop layer when the amorphous carbon layer 340 is used as a sacrificial layer. The amorphous carbon layer 340 can provide a CMP stop layer and a tunable ARC layer.

Figure 3A:
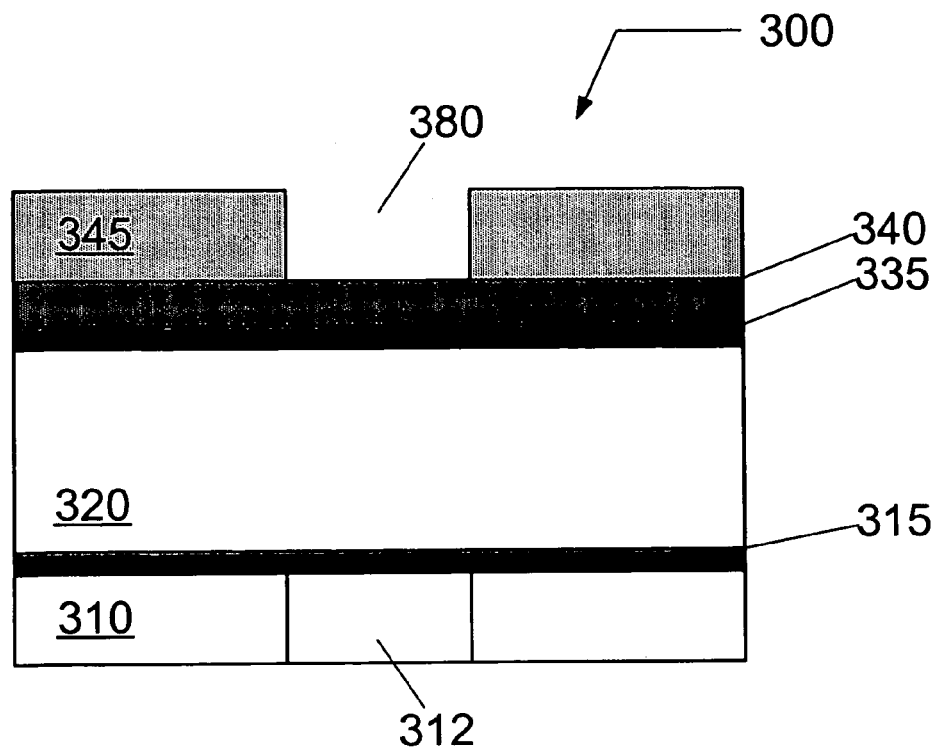
FIGS. 3A through 3F present a simplified schematic representation of a method of forming an interconnect structure in accordance with another embodiment of the present invention.
Figure 3B:
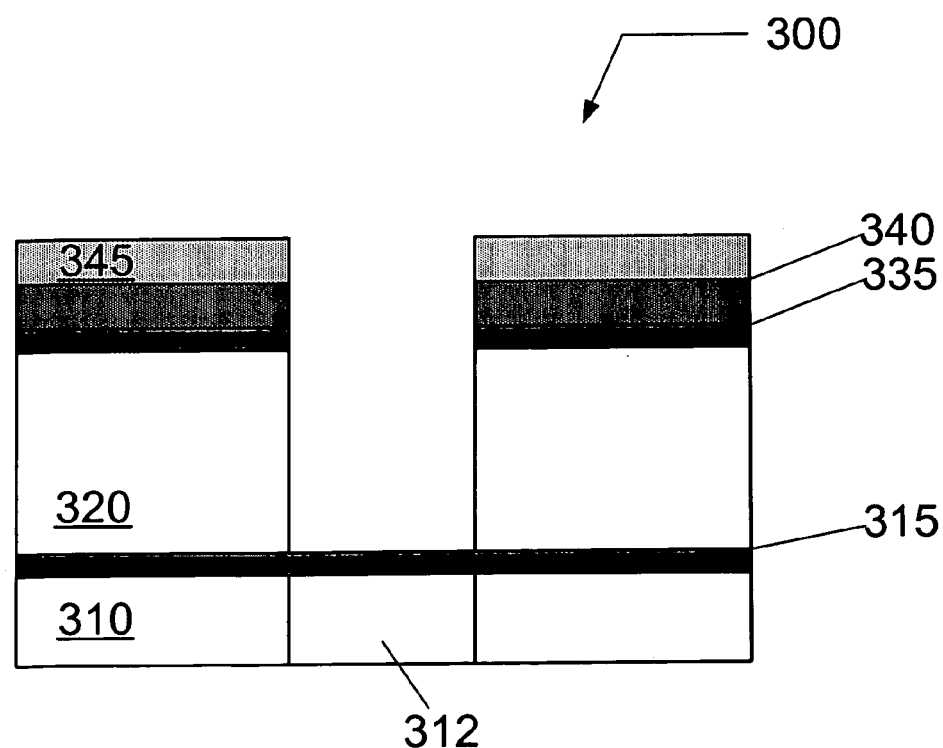

Once the layer of light-sensitive material 345 is formed on film stack 300, it can be patterned with a first pattern 380 using micro-lithography, as described above. The first pattern 380 can, for example, comprise a pattern for a via, or contact. As shown in FIG. 3B, the first pattern 380 can be transferred to the amorphous carbon layer 340, the hard mask layer 335, and the dielectric layer 320 using, for example, dry plasma etching. The etching process for each layer can comprise steps, and chemistries similar to those described above. Any remaining light-sensitive material 345 is then removed using plasma or other chemical techniques known to those skilled in the art.

Figure 3C:
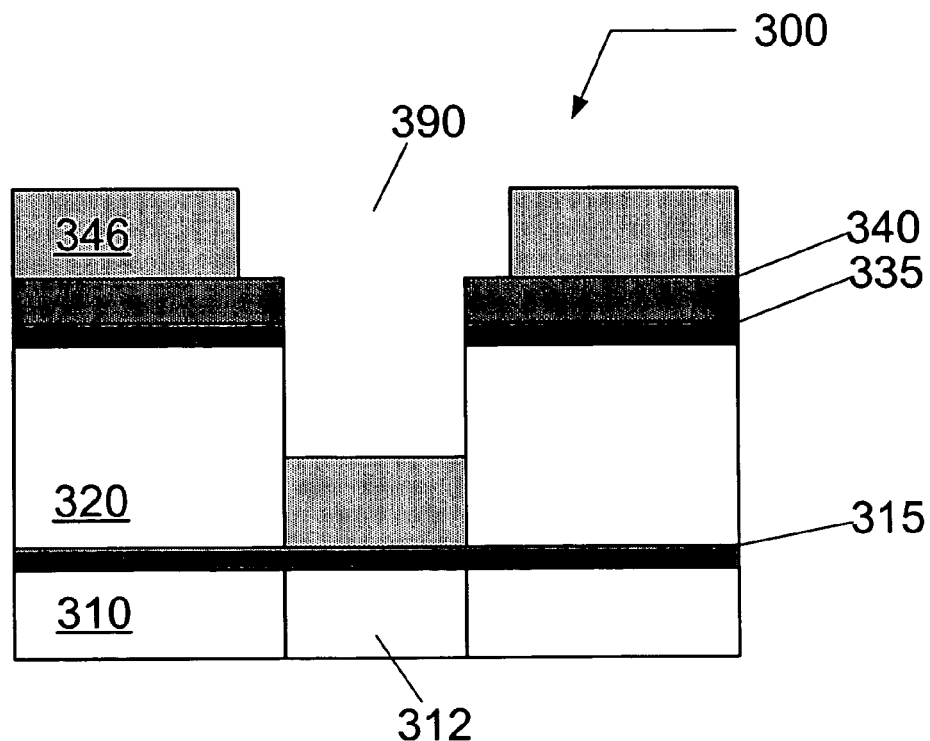
Figure 3D:
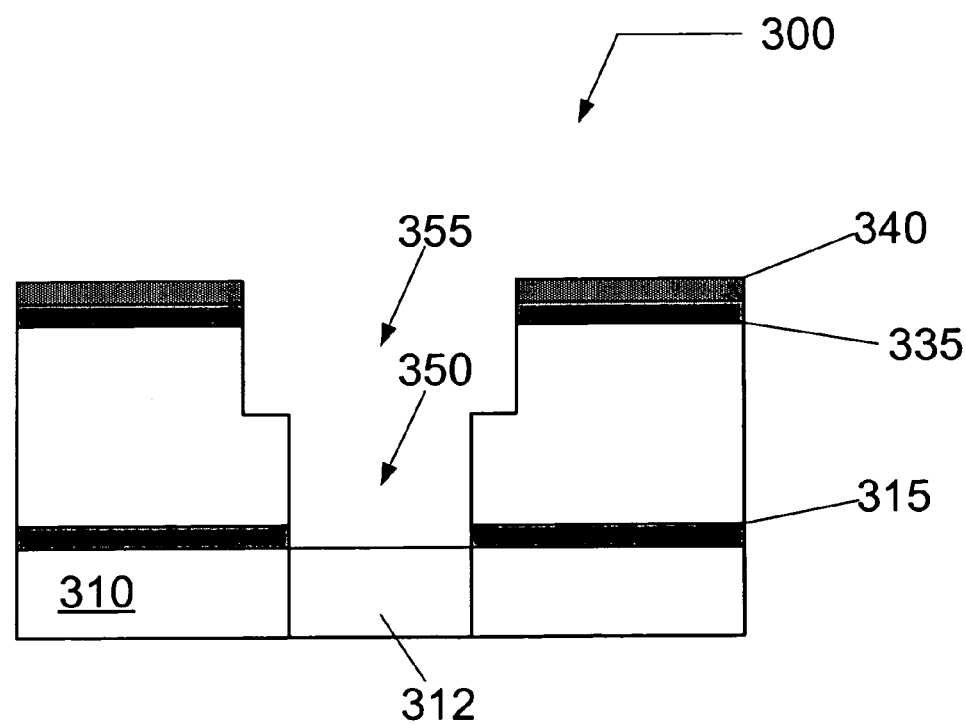

Referring now to FIG. 3C, another layer of light-sensitive material 346 is formed on film stack 300 using techniques described above. Therein, a second pattern 390 is formed using micro-lithography. The second pattern 390 can, for example, comprise a trench pattern. Once the second pattern 390 is formed in the layer of light-sensitive material 346, the second pattern 390 is transferred to the amorphous carbon layer 340, the hard mask layer 335 and an upper portion of the dielectric layer 320. The depth to which the second pattern 390 is transferred into the dielectric layer 320 can be adjusted by decreasing, or increasing, the etch time during the etching process. Any remaining light-sensitive material 346 is then removed using plasma or other chemical techniques known to those skilled in the art. Thereafter, as shown in FIG. 3D, the first pattern 380 is transferred to the metal cap layer 315, hence, completing the formation of, for example, a via structure 350 and a trench structure 355. In one embodiment, the via structure 350 and trench structure 255 are simultaneously filled with metal such as copper. In this embodiment, the amorphous carbon layer 340 can serve as a sacrificial layer and the hard mask layer 335 can serve as a CMP stop layer in a CMP process of planarizing the copper.

Figure 3E:
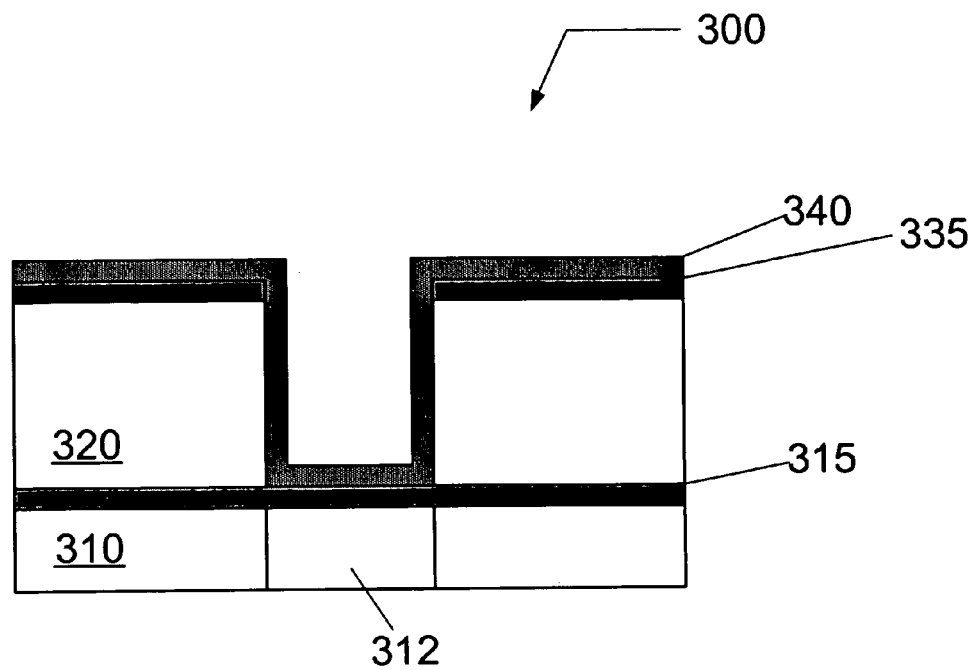
Figure 3F:
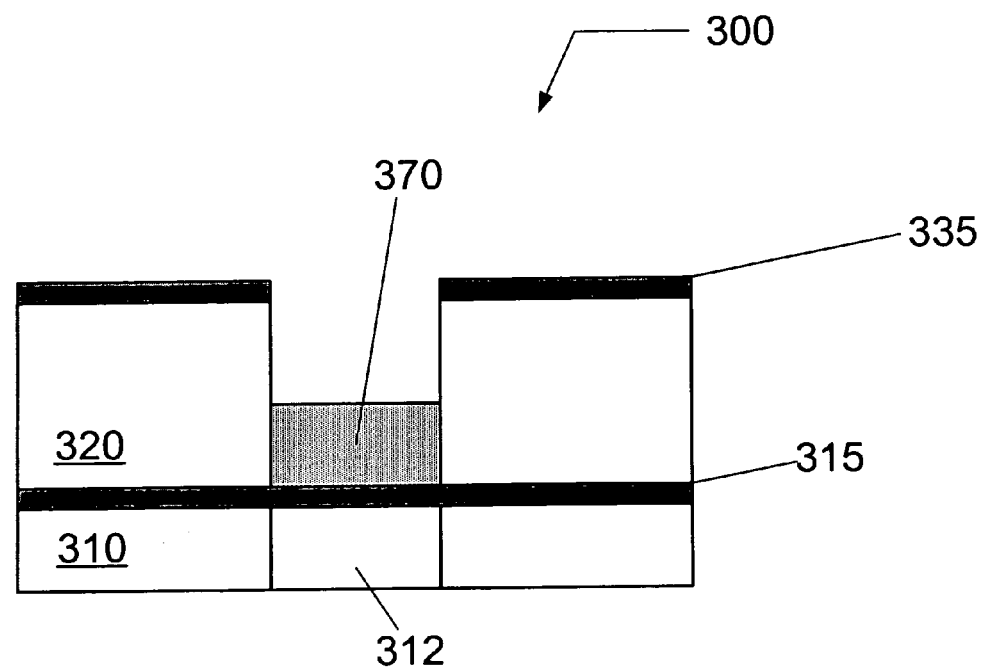

As described above, it is possible that during the removal of the light-sensitive layer 345 following the pattern transfer of the first pattern 380, the ashing (or stripping) process can affect the properties of amorphous carbon layer 340. Therefore, in one embodiment, the amorphous carbon layer 340 can be removed and re-deposited as shown in FIG. 3E. In this embodiment, the hard mask 335 can serve as an etch stop layer or CMP stop layer to prevent damage to the dielectric layer 320. Thereafter, the pattern transfer of the second pattern 390 can be performed as shown in FIGS. 3C and 3D. During this etching process, however, the amorphous carbon layer 340 may or may not be entirely removed from the exposed sidewalls of the dielectric layer 320. In an alternate embodiment, as shown in FIG. 3F, the amorphous carbon layer 340 is removed following the first pattern transfer, and a BARC layer 370 is applied using, for example, spin coating techniques. The BARC layer material 370 filling via structure 350 may then be partially removed or recessed using a dry plasma etch. The etch gas composition may include at least one of a fluorocarbon gas, a nitrogen-containing gas, a hydrogen-containing gas, or an oxygen-containing gas. Thereafter, the pattern transfer of the second pattern 390 can be performed using standard techniques known to those skilled in the art.

According to yet another embodiment, FIGS. 4A through 4K present a schematic representation of a method of forming an interconnect structure in a film stack 400. The method can be characterized as the integration of an amorphous carbon layer into a multiple hard mask trench first dual damascene structure. The film stack 400 comprises a substrate 410 having a metal line 412 formed therein, a metal cap layer 415 formed on the substrate 410, a first dielectric layer 420 formed on the metal cap layer 415, an (optional) etch stop layer 425 formed on the first dielectric layer 420, a second dielectric layer 430 formed on the (optional) etch stop layer 425, a hard mask layer 435 formed on the second dielectric layer 430, a first amorphous carbon layer 440 formed on the hard mask layer 435, a second amorphous carbon layer 441 formed on the first amorphous carbon layer 440, and a layer of light-sensitive material 445 formed on the second amorphous carbon layer 441, and it can be prepared in much the same manner as the film stack 100 described in FIG. 1A. The hard mask layer 435 can provide at least one of a lower layer in a dual hard mask structure and a CMP stop layer. The second amorphous carbon layer 441 can provide at least one of a top hard mask, a tunable ARC layer, a CMP stop layer, and a sacrificial layer when the hard mask layer 435 is utilized as CMP stop layer in a dual damascene structure.

Figure 4A:
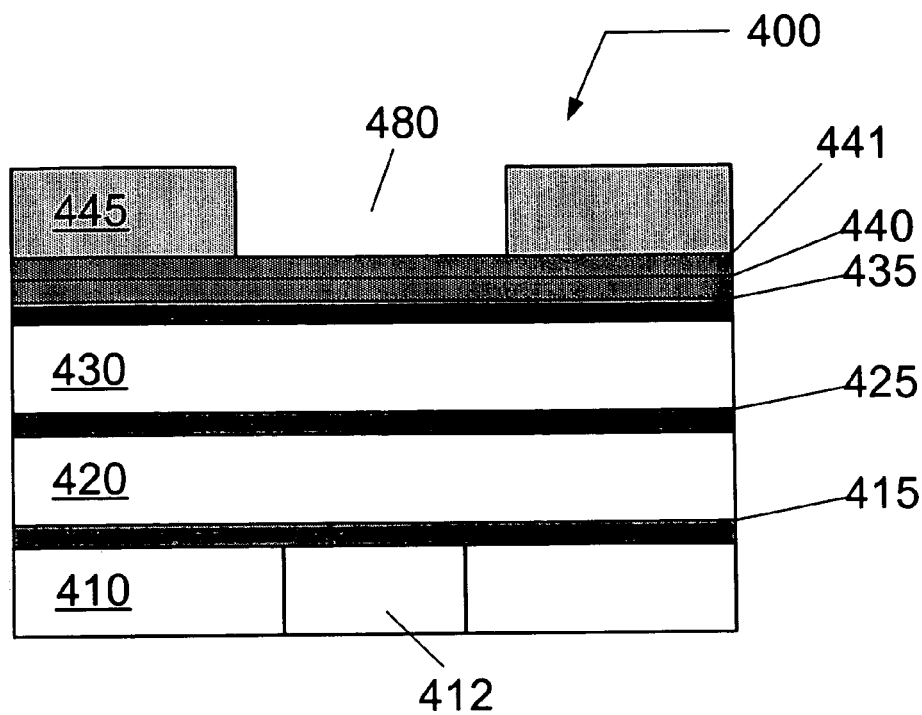
FIGS. 4A through 4J present a simplified schematic representation of a method of forming an interconnect structure in accordance with another embodiment of the present invention.
Figure 4B:
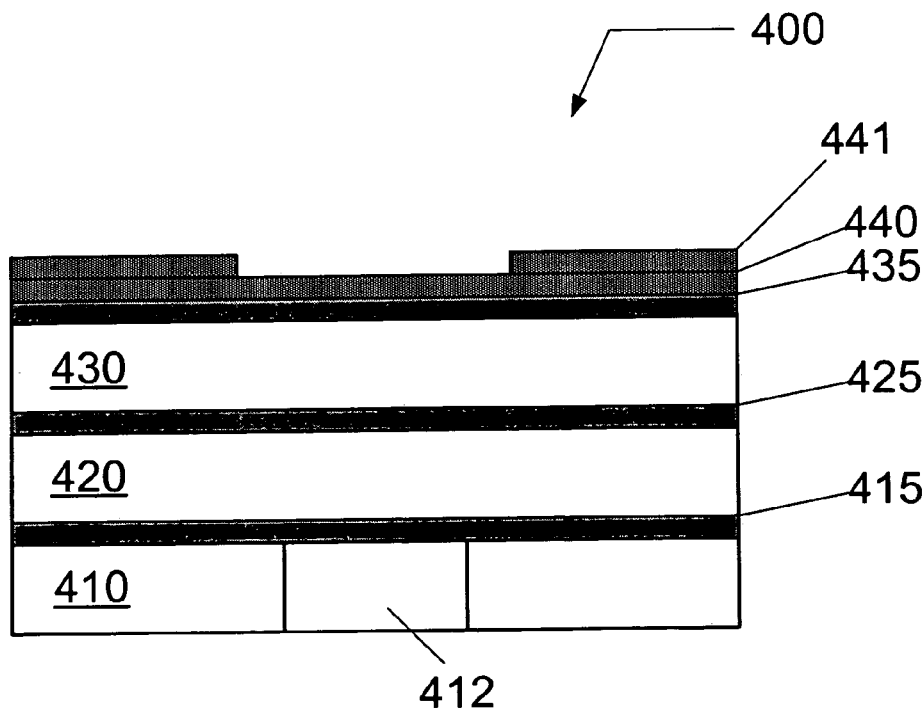

Once the layer of light-sensitive material 445 is formed on film stack 400, it can be patterned with a first pattern 480 using micro-lithography, as described above. The first pattern 480 can, for example, include a pattern for a trench. As shown in FIG. 4B, the first pattern 480 can be transferred to the second amorphous carbon layer 441 using, for example, dry plasma etching. The etching process can comprise steps, and chemistries similar to those described above. Any remaining light-sensitive material 445 may then be removed using plasma or other chemical techniques known to those skilled in the art.

Figure 4C:
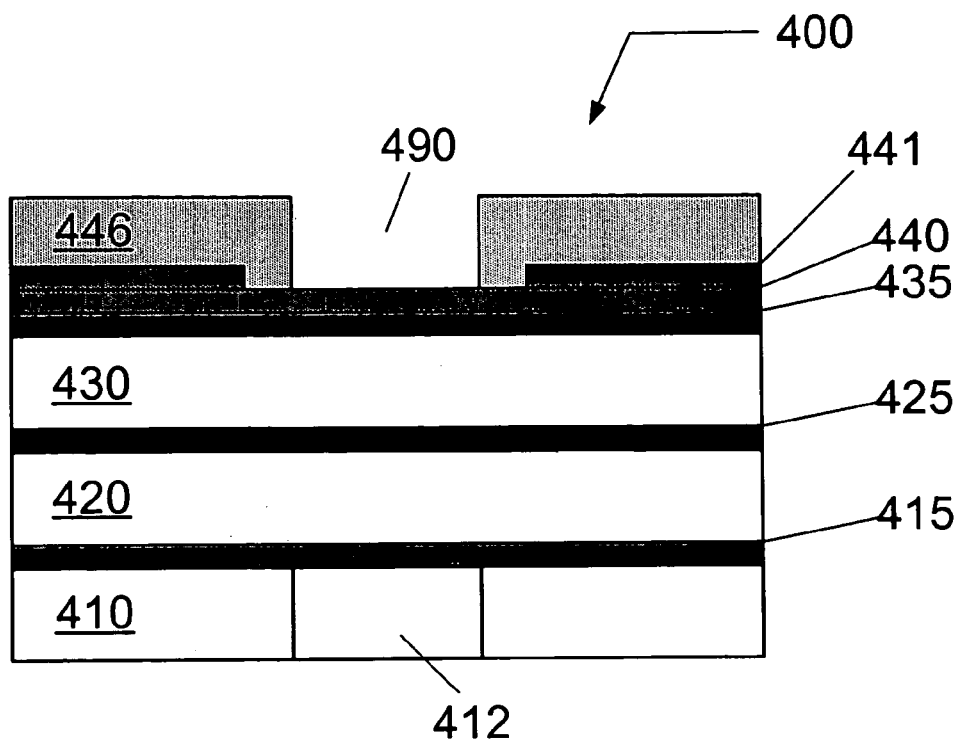
Figure 4D:
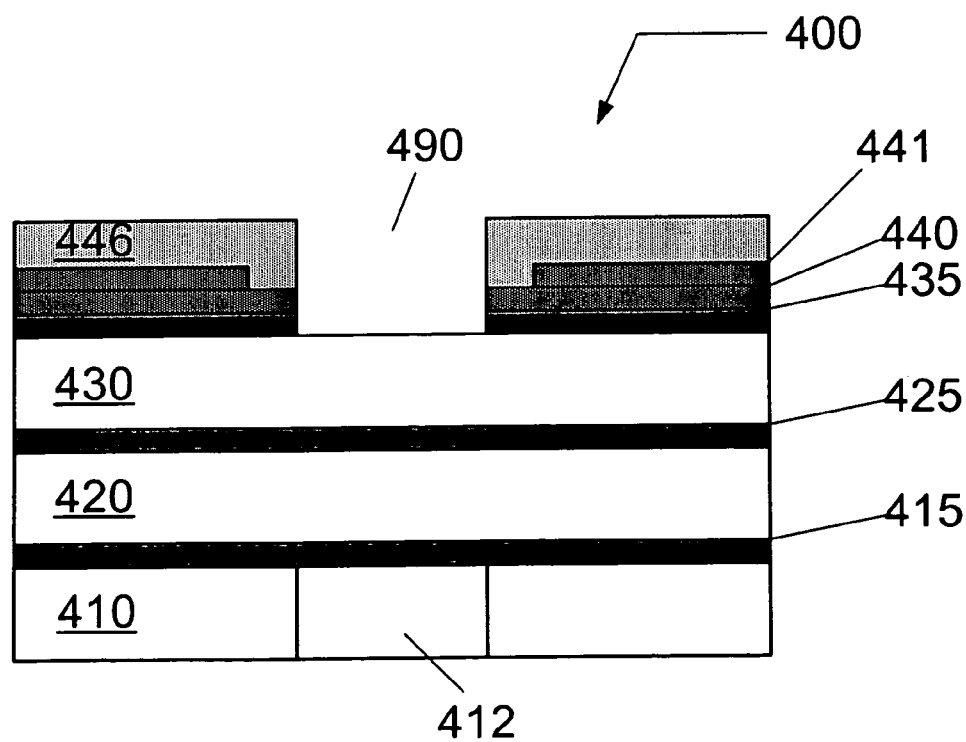

Referring now to FIG. 4C, another layer of light-sensitive material 446 is formed on film stack 400 using techniques described above. Therein, a second pattern 490 is formed using micro-lithography. The second pattern 490 can, for example, comprise a via pattern. As shown in FIG. 4D, once the second pattern 490 is formed in the layer of light-sensitive material 445, the second pattern 490 is transferred to the first amorphous carbon layer 440, and the hard mask layer 435.

Figure 4E:
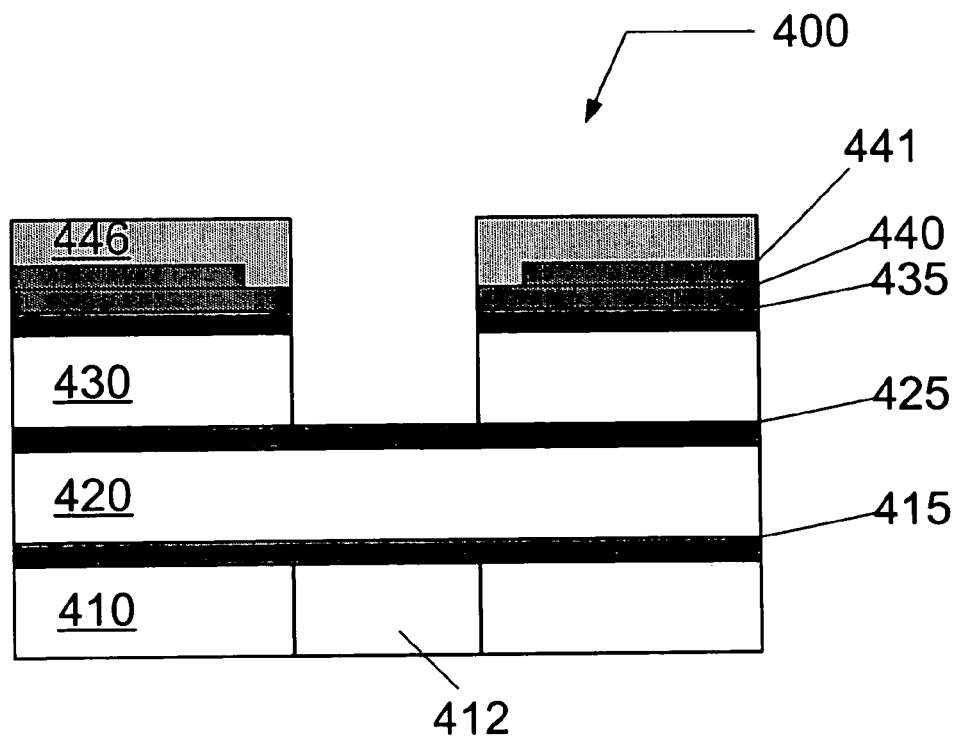
Figure 4F:
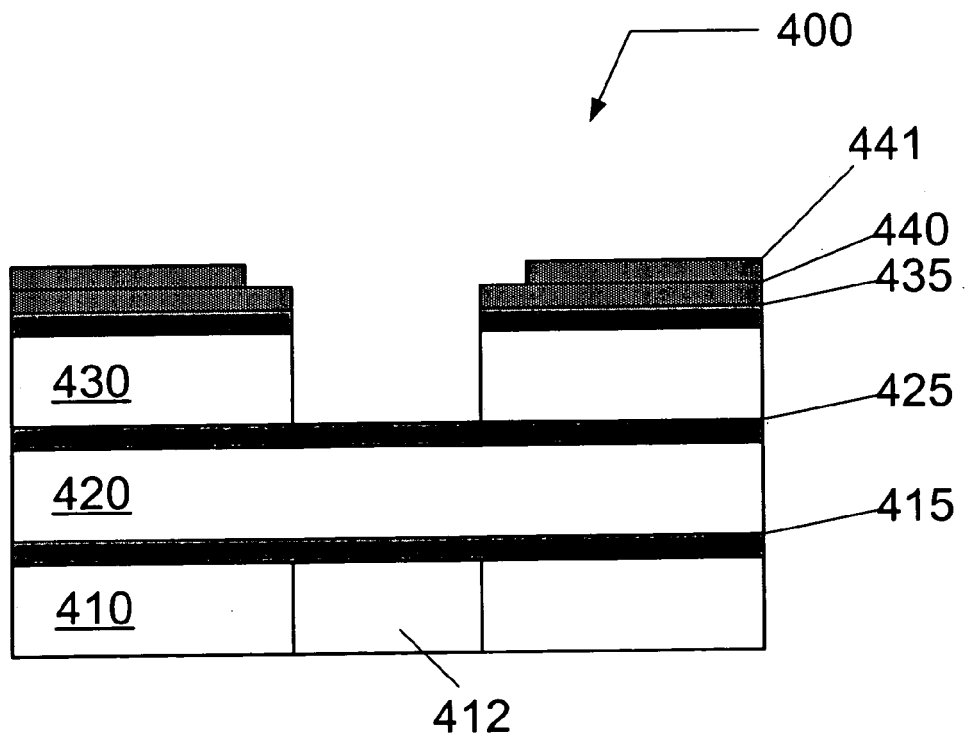

Thereafter, as shown in FIG. 4E, the second pattern 490 is transferred to the second dielectric layer 430. Referring now to FIG. 4F, any remaining light-sensitive material 446 is then removed using plasma or other chemical techniques known to those skilled in the art.

Figure 4G:
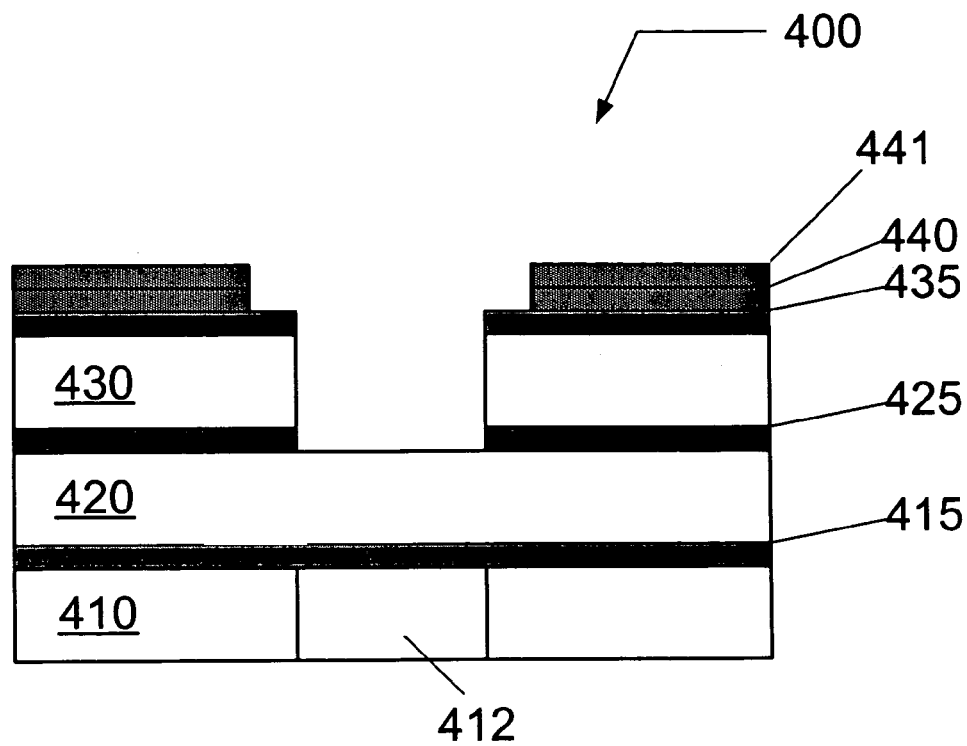

In FIG. 4G, the first pattern 480 is transferred to the first amorphous carbon layer and the second pattern 490 is transferred to the (optional) etch stop layer 425. The transfer of the first pattern and the second pattern to the first amorphous carbon layer and the (optional) etch stop layer, respectively, can be performed simultaneously, wherein the etching process for the first amorphous carbon layer stops on the hard mask layer 435, and the etching process for the (optional) etch stop layer stops on the first dielectric layer 420. The etching processes can comprise dry plasma etching, utilizing plasma chemistries such as those described above for dielectric layers. The etching processes can be chosen to exhibit any one of profile and critical dimension (CD) control, etch uniformity (across the substrate), a flat etch front in order to avoid micro-trenching, and first pattern/second pattern corner selectivity.

Figure 4H:
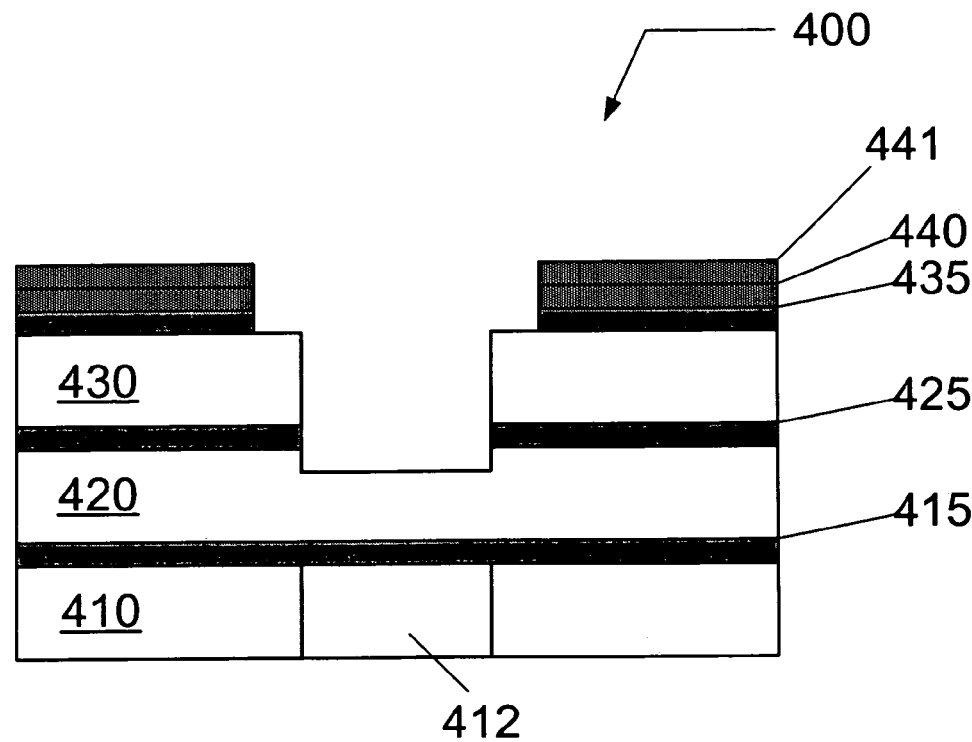
Figure 4I:
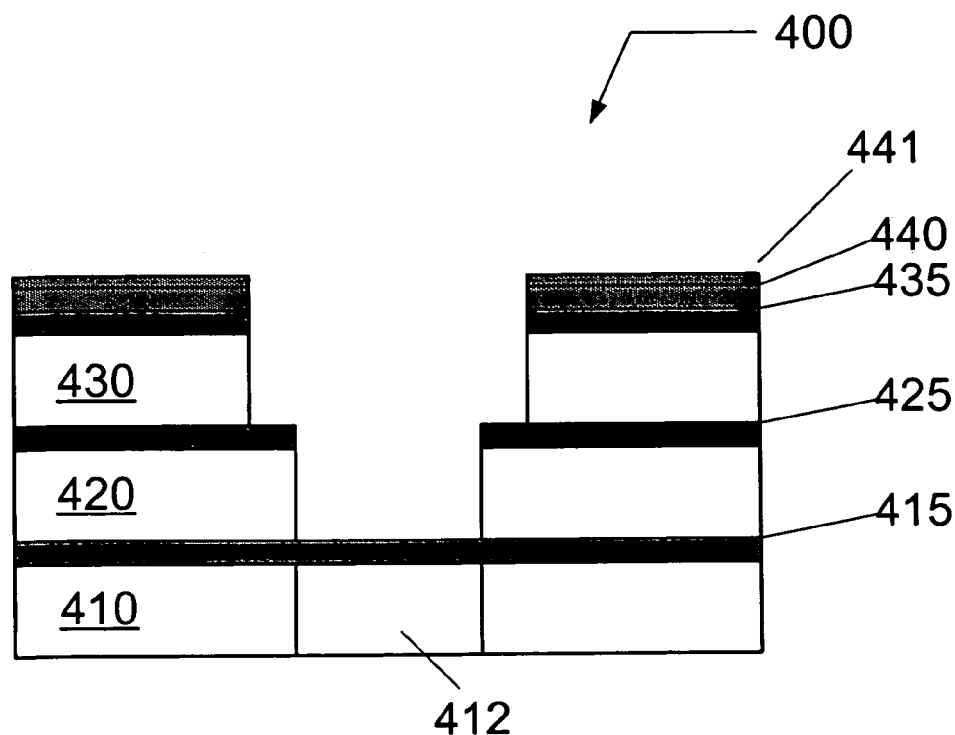

Referring now to FIG. 4H, the first pattern 480 is transferred to the hard mask layer 435 and the second pattern 490 is partially transferred to the first dielectric layer 420. Thereafter, as shown in FIG. 4I, the first pattern 480 is transferred to the second dielectric layer 430 and the second pattern 490 is transferred to the first dielectric layer 420. The transfer of the first pattern and the second pattern to the second dielectric layer and the first dielectric layer, respectively, can be performed simultaneously, wherein the etching process for the second dielectric layer stops on the etch stop layer 425, and the etching process for the first dielectric layer stops on the metal cap layer 415. The etching processes can comprise dry plasma etching, utilizing plasma chemistries such as those described above for dielectric layers. The etching processes can be chosen to exhibit any one of profile and critical dimension (CD) control, etch uniformity (across the substrate), a flat etch front in order to avoid micro-trenching, and first pattern/second pattern corner selectivity.

Figure 4J:
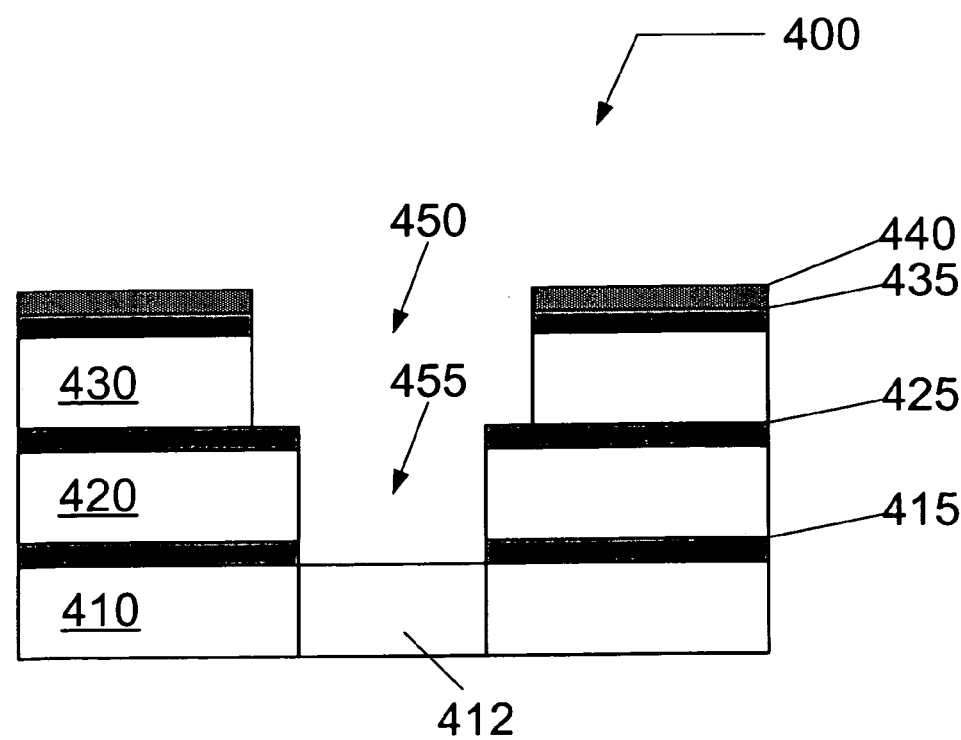

Thereafter, as shown in FIG. 4J, the second pattern 490 is transferred to the metal cap layer 415, hence, completing the formation of, for example, a via structure 455 and a trench structure 450. In one embodiment, the via structure 455 and trench structure 450 are simultaneously filled with metal such as copper. In this embodiment, the amorphous carbon layer 440 can serve as a sacrificial layer and the hard mask layer 435 can serve as a CMP stop layer in a CMP process of planarizing the copper.

According to another embodiment, FIGS. 5A through 5D present a schematic representation of a method of forming an interconnect structure in a film stack 500. The method can be characterized as the integration of an amorphous carbon layer with a buried via mask dual damascene structure. The film stack 500 comprises a substrate 510 having a metal line 512 formed therein, a metal cap layer 515 formed on the substrate 510, a first dielectric layer 520 formed on the metal cap layer 515, a first amorphous carbon layer 540 formed on the first dielectric layer 520, and a layer of light-sensitive material 545 formed on the first amorphous carbon layer 540. Each layer can be prepared in much the same manner as the film stack 100 described in FIG. 1A.

Figure 5A:
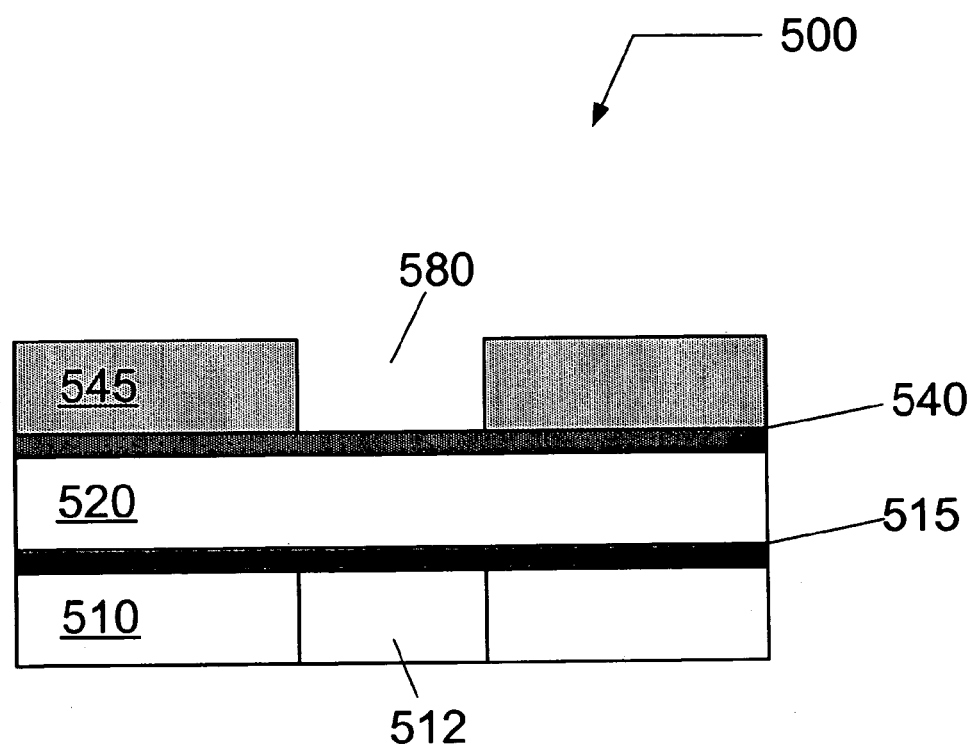
FIGS. 5A through 5D present a simplified schematic representation of a method of forming an interconnect structure in accordance with another embodiment of the present invention.
Figure 5B:
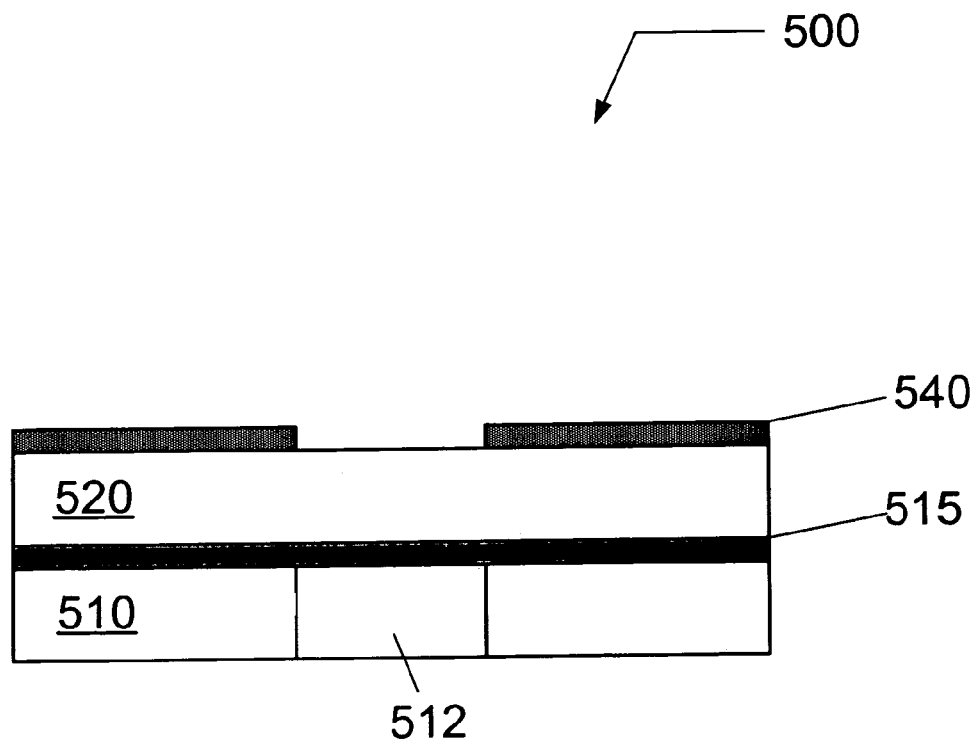

Once the layer of light-sensitive material 545 is formed on film stack 500, it can be patterned with a first pattern 580 using micro-lithography, as described above. The first pattern 580 can, for example, comprise a pattern for a via, or contact. As shown in FIG. 5B, the first pattern 580 can be transferred to the first amorphous carbon layer 540 using, for example, dry plasma etching. The etching process for the first amorphous carbon layer can comprise steps, and chemistries similar to those described above. Following the etching process, the remaining layer of light-sensitive material 545 is removed using plasma or other chemical techniques known to those skilled in the art.

Figure 5C:
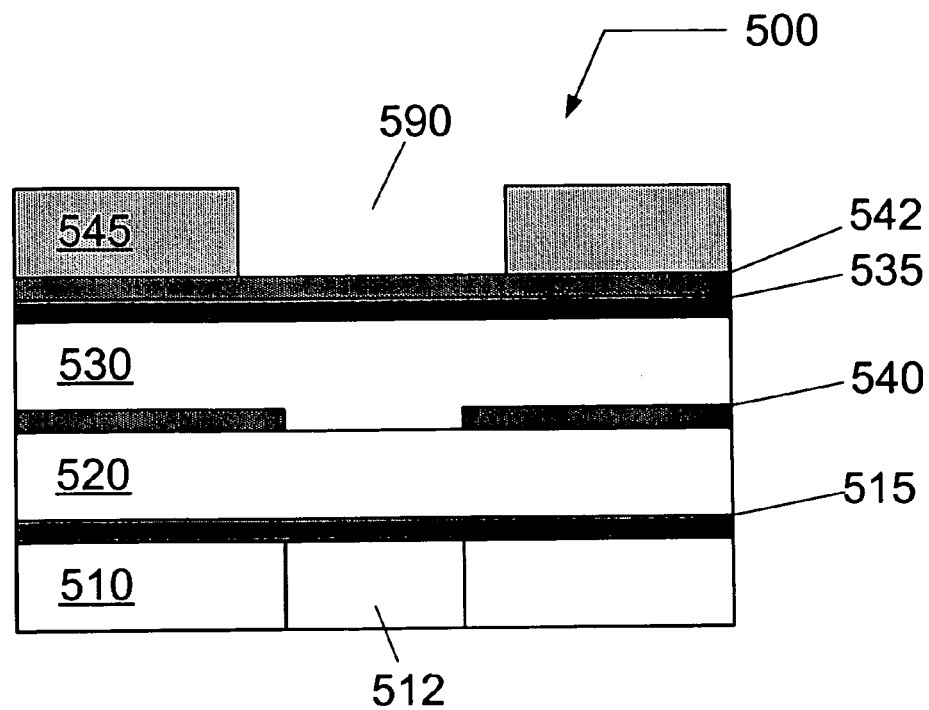

Now referring to FIG. 5C, a second dielectric layer 530 is formed on the patterned first amorphous carbon layer 540, a hard mask layer 535 is formed on the second dielectric layer 530, a second amorphous carbon layer 542 is formed on the hard mask layer 535, and another layer of light-sensitive material 546 is formed on the second amorphous carbon layer 542. Each layer can be prepared in much the same manner as the film stack 100 described in FIG. 1A. The hard mask layer 535 can provide at least one of a bottom hard mask and a CMP stop layer, and amorphous carbon layer 540 can provide at least one of a top hard mask, a tunable ARC layer, a CMP stop layer, and a sacrificial layer when the hard mask layer 535 is utilized as CMP stop layer in a dual damascene structure.

Figure 5D:
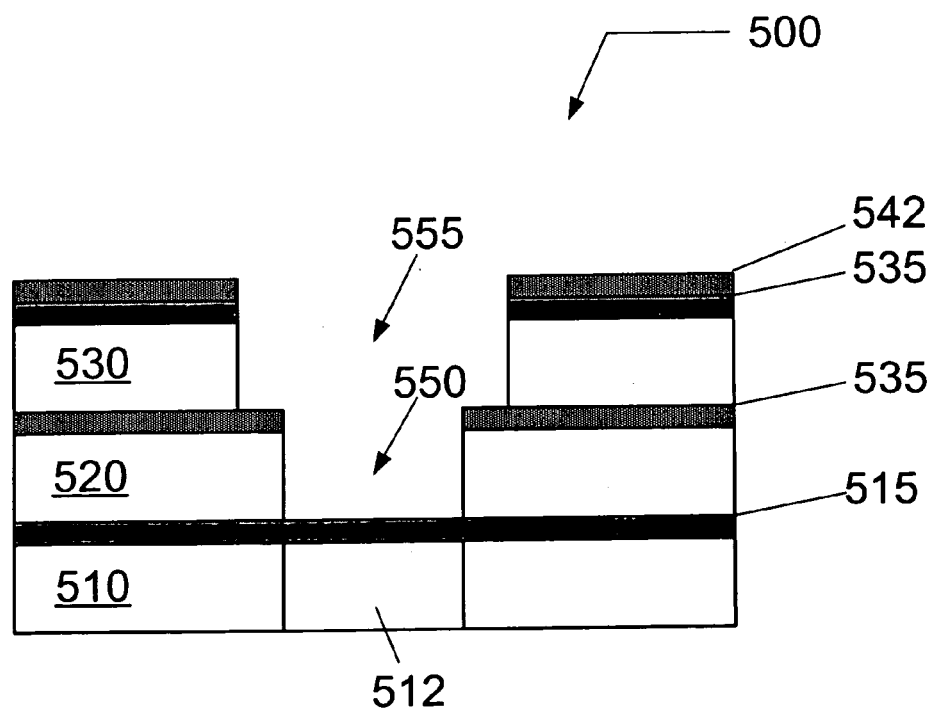

Once the additional layer of light-sensitive material 546 is formed on film stack 500, a second pattern 590 is formed using micro-lithography. The second pattern 590 can, for example, comprise a pattern for a trench. As shown in FIG. 5D, once the second pattern 590 is formed in the layer of light-sensitive material 546, the second pattern 590 is transferred to the second amorphous carbon layer 542, the hard mask layer 535, and the second dielectric layer 530 using, for example, dry plasma etching. While the first amorphous carbon layer 540 serves as an etch stop layer, the first pattern 580 is transferred to the first dielectric layer 520 using, for example, dry plasma etching. Any remaining light-sensitive material 546 may then removed using plasma or other chemical techniques known to those skilled in the art. Thereafter, the metal cap layer 515 can be removed, hence, completing the formation of, for example, a via structure 550 and a trench structure 555. The etching processes for each layer can comprise steps, and chemistries similar to those described above. Moreover, in one embodiment, the via structure 550 and trench structure 555 are simultaneously filled with metal such as copper. In this embodiment, the amorphous carbon layer 542 can serve as a sacrificial layer and the hard mask layer 535 can serve as a CMP stop layer in a CMP process of planarizing the copper.

According to another embodiment, FIGS. 6A through 6I present a schematic representation of a method of forming an interconnect structure in a film stack 600. The method can be characterized as the integration of an amorphous carbon layer with single damascene structure. The film stack 600 comprises a substrate 610 having a metal line 612 formed therein, a metal cap layer 615 formed on the substrate 610, a first dielectric layer 620 formed on the metal cap layer 615, an first hard mask 625 formed on the first dielectric layer 620, a first amorphous carbon layer 640 formed on the first hard mask 625, and a layer of light-sensitive material 645 formed on the first amorphous carbon layer 640. Each layer can be prepared in much the same manner as the film stack 100 described in FIG. 1A.

When film stack 600 includes hard mask layer 625, hard mask layer 625 can provide at least one of a hard mask, or a CMP stop layer, and first amorphous carbon layer 640 can provide at least one of a top hard mask, a tunable ARC layer, and a CMP stop layer.

Figure 6A:
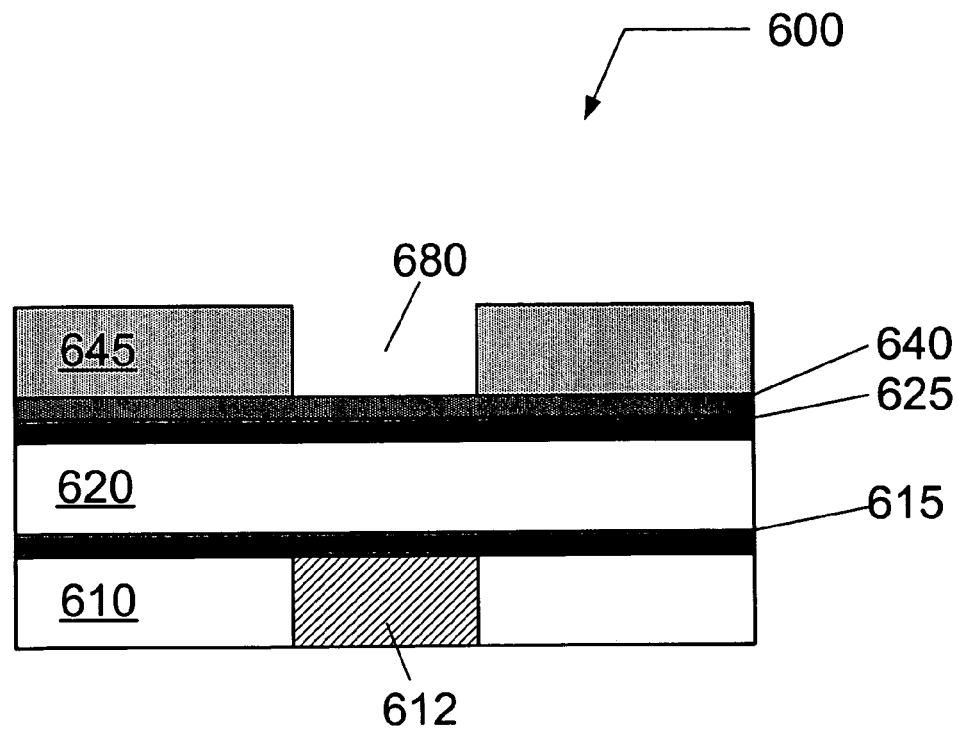
FIGS. 6A through 6I present a simplified schematic representation of a method of forming an interconnect structure in accordance with another embodiment of the present invention.
Figure 6B:
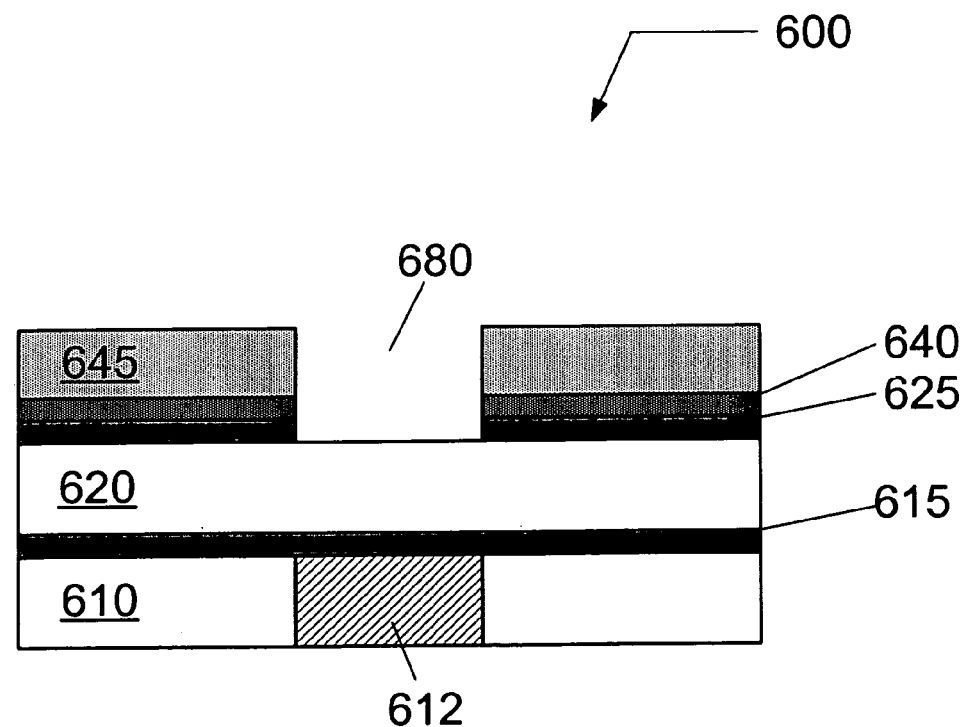
Figure 6C:
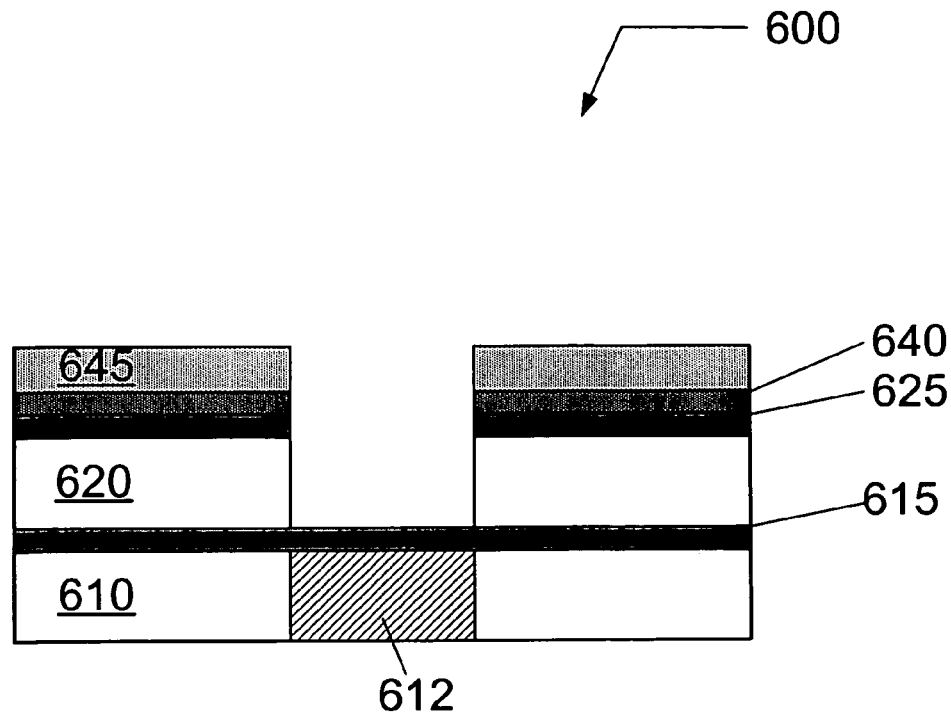
Figure 6D:
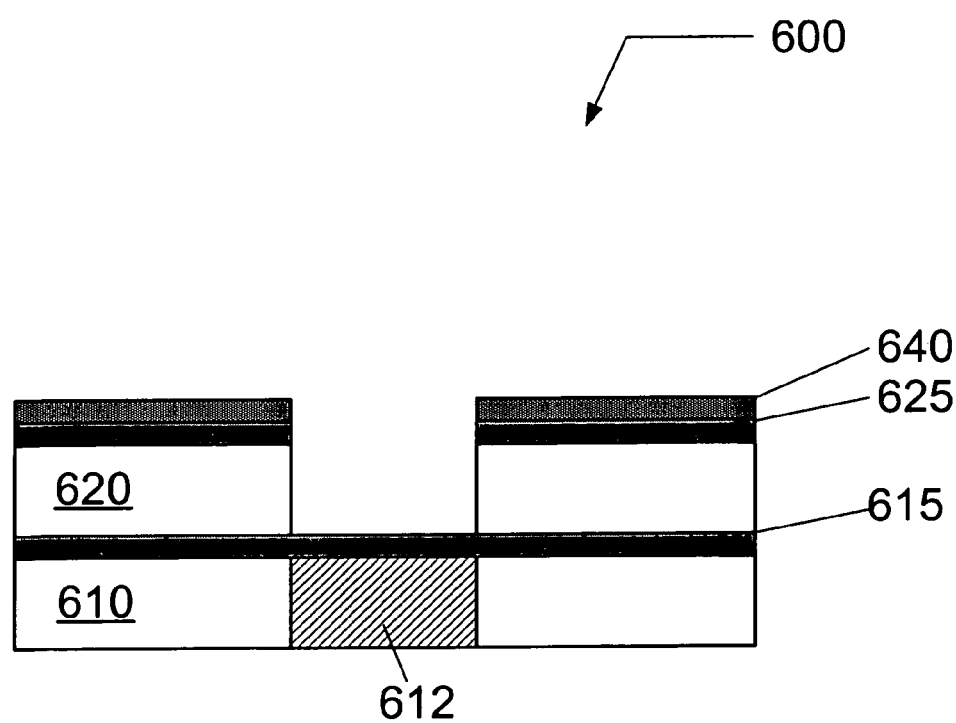

Once the layer of light-sensitive material 645 is formed on film stack 600, it can be patterned with a first pattern 680 using micro-lithography, as described above. The first pattern 680 can, for example, comprise a pattern for a via, or contact. As shown in FIG. 6B, the first pattern 680 can be transferred to the first amorphous carbon layer 640 and the (optional) first hard mask 625 using, for example, dry plasma etching. The etching process(es) can comprise steps, and chemistries similar to those described above. Thereafter, as shown in FIG. 6C, the first pattern 680 is transferred to the first dielectric layer 620 using, for example, dry plasma etching. The etching process can comprise steps, and chemistries similar to those described above. Following the etching process, as illustrated in FIG. 6D, the remaining layer of light-sensitive material 645 is removed using plasma or other chemical techniques known to those skilled in the art.

Figure 6E:
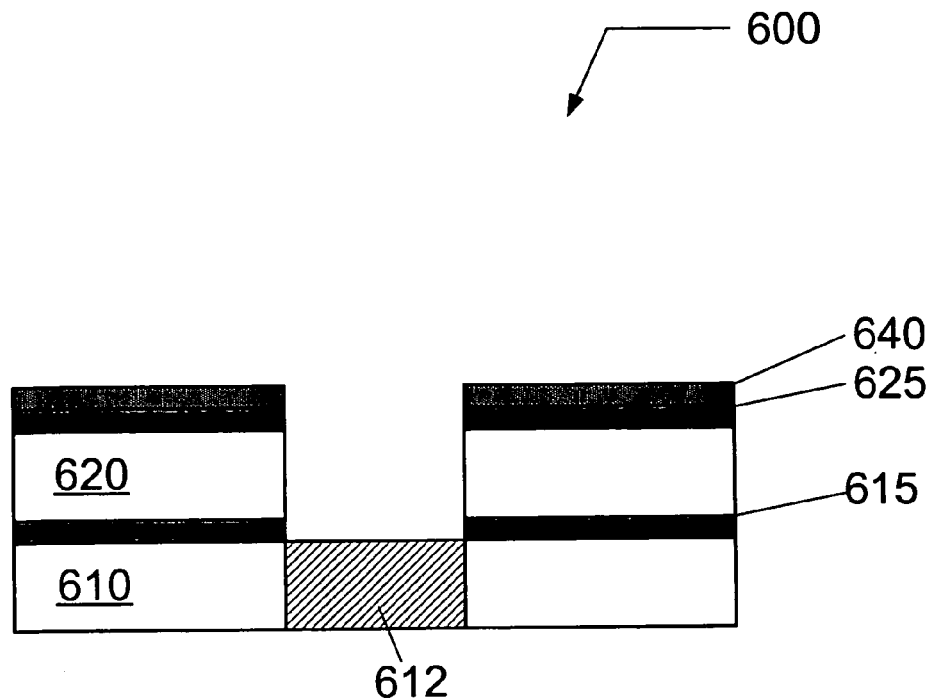

Referring now to FIG. 6E, the first pattern 680 is transferred to the metal cap layer 615 using, for example, dry plasma etching. The etching process can comprise steps, and chemistries similar to those described above.

Figure 6F:
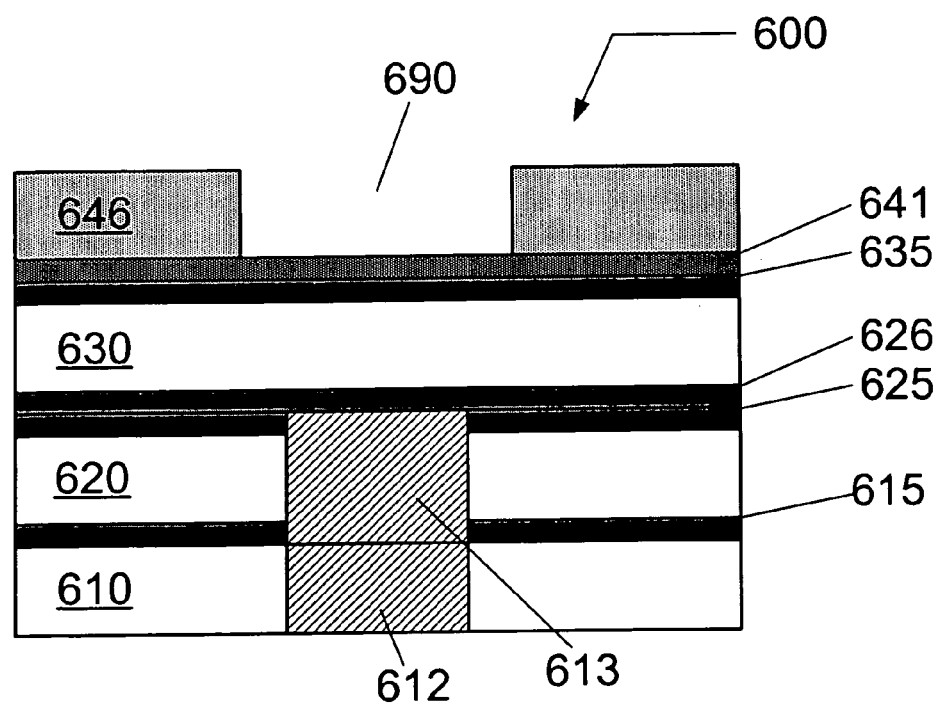

Now referring to FIG. 6F, metal, such as aluminum or copper, is deposited on film stack 600 to fill the first pattern (or via) in the first dielectric layer 620 using at least one of physical vapor deposition (PVD), CVD, PECVD, electroplating, or any combination thereof. Once the metal deposition is complete, the metal is polished, using, for example, CMP, to the first hard mask layer 625. In this embodiment, the amorphous carbon layer 640 is used as a sacrificial layer and the hard mask 625 is a CMP stop layer. Thereafter, a second metal cap layer 626 is formed on the first hard mask layer 625 and metal-filled first pattern (or via) 613, a second dielectric layer 630 is formed on the second metal cap layer 626, a second hard mask layer 635 is formed on the second dielectric layer 630, a second amorphous carbon layer 641 is formed on the second hard mask layer 635, and another layer of light-sensitive material 646 is formed on the second amorphous carbon layer 641. Each layer can be prepared in much the same manner as the film stack 100 described in FIG. 1A. Hard mask layer 635 can provide at least one of a hard mask, or a CMP stop layer, and second amorphous carbon layer 641 can provide at least one of a top hard mask, a tunable ARC layer, and a CMP stop layer.

Figure 6G:
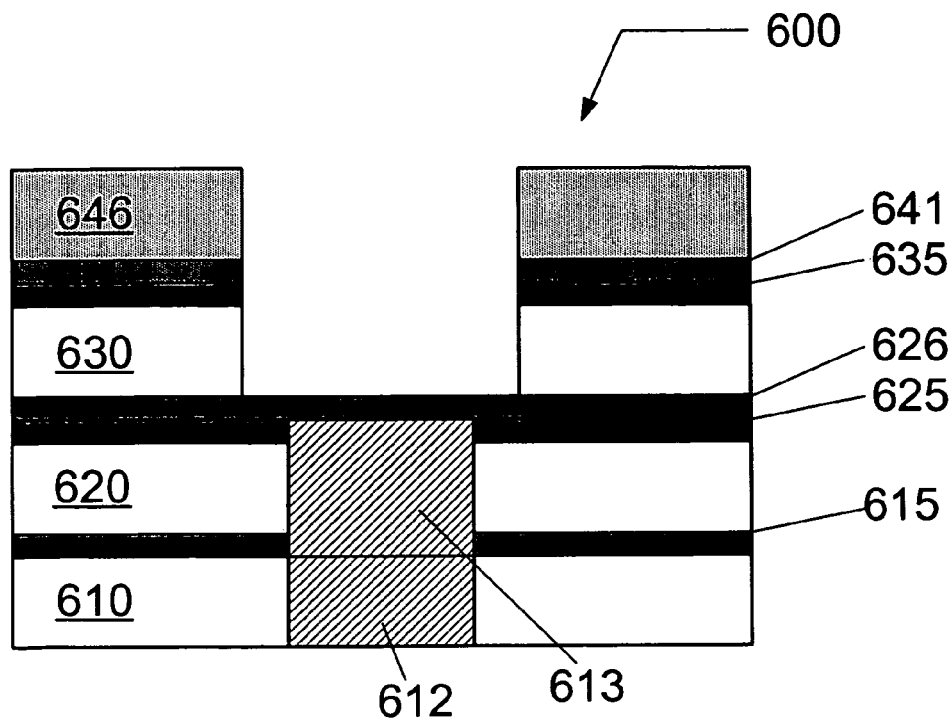
Figure 6H:
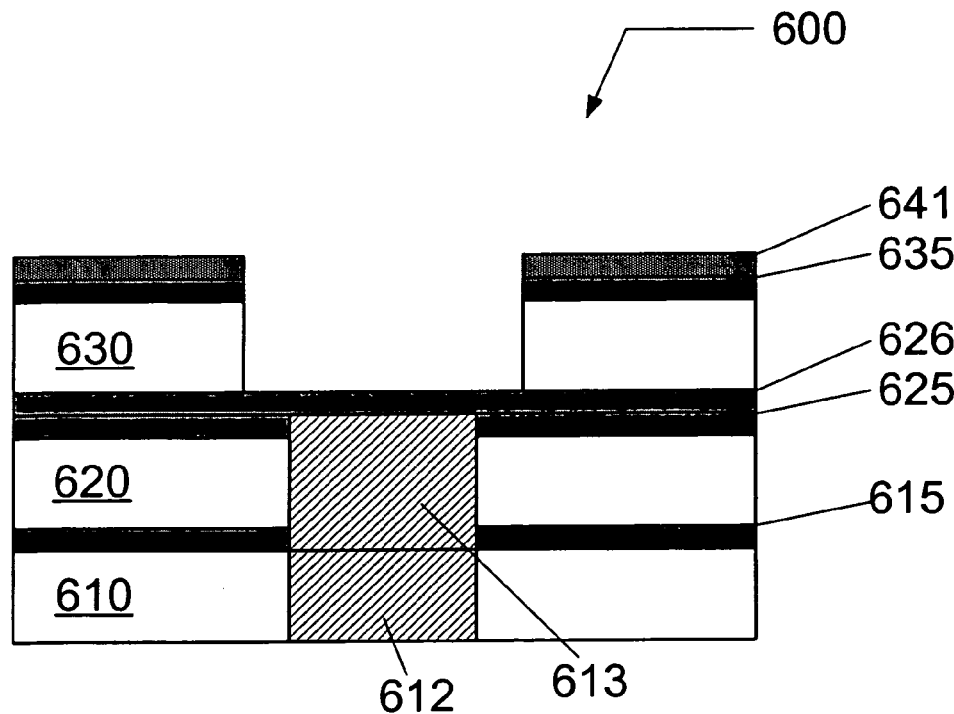
Figure 6I:
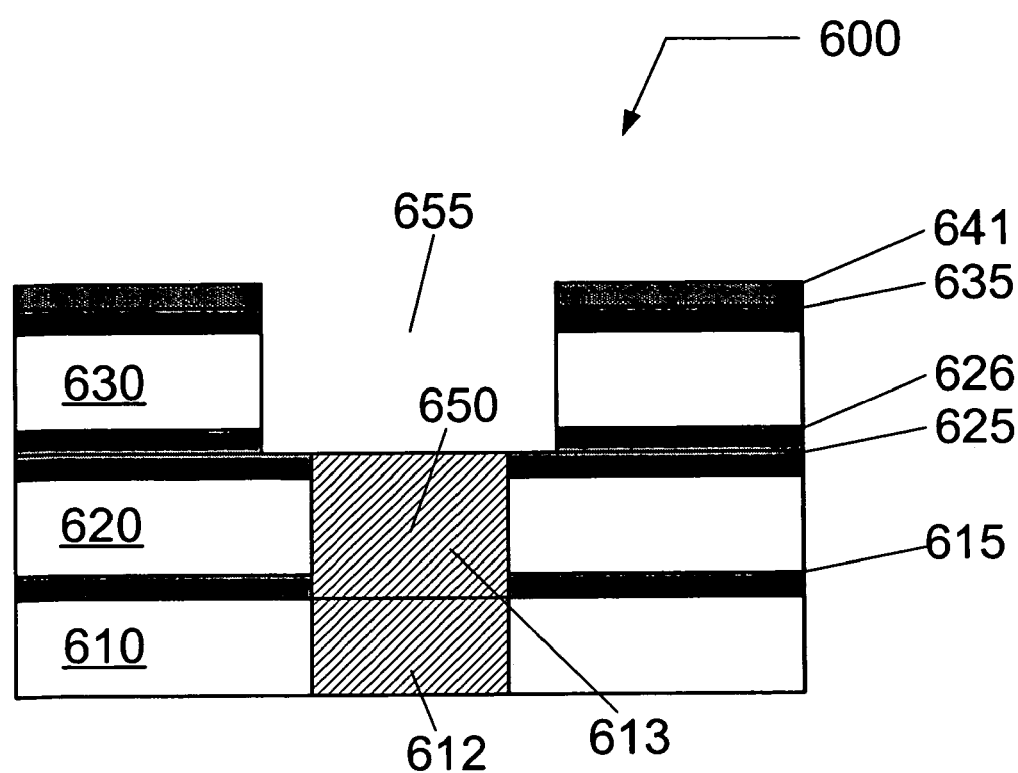

Once the additional layer of light-sensitive material 646 is formed on film stack 600, a second pattern 690 is formed using micro-lithography. The second pattern 690 can, for example, comprise a pattern for a trench. As shown in FIG. 6G, once the second pattern 690 is formed in the layer of light-sensitive material 646, the second pattern 690 is transferred to the second amorphous carbon layer 641, the second hard mask layer 635, and the second dielectric layer 630 using, for example, dry plasma etching. As illustrated in FIG. 6H, any remaining light-sensitive material 646 may then removed using plasma or other chemical techniques known to those skilled in the art. Thereafter, the second metal cap layer 626 can be removed, hence, completing the formation of, for example, a via structure 650 (filled with metal) and a trench structure 655 (prepared for metal fill). The etching processes for each layer can comprise steps, and chemistries similar to those described above. In one embodiment, the trench structure 655 is filled with metal such as copper. In this embodiment, the amorphous carbon layer 641 can serve as a sacrificial layer in a CMP process of planarizing the copper.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A semiconductor device comprising:
    a semiconductor substrate;
    a film stack formed on the semiconductor substrate and including a film to be processed;
    a dual hard mask comprising an amorphous carbon layer and an underlying hard mask layer interposed between the amorphous carbon layer and the film to be processed, said hard mask layer not including an amorphous carbon layer, said amorphous carbon layer having at least one optical property that substantially matches the corresponding optical property of said film stack, wherein said at least one optical property includes at least one of an index of refraction and an extinction coefficient; and
    a damascene structure for a metal interconnect formed in the film stack.

2. The device of claim 1, wherein said amorphous carbon layer comprises a part of a lithographic structure during the formation of said metal interconnect in said film stack.

3. The device of claim 1, wherein said amorphous carbon layer comprises a chemical mechanical polishing (CMP) stop layer for said damascene structure.

4. The device of claim 1, wherein said amorphous carbon layer is an anti-reflective layer.

5. The device of claim 1, wherein said index of refraction comprises a value ranging from 1.5 to 1.9.

6. The device of claim 1, wherein said extinction coefficient comprises a value ranging from 0.1 to 1.0.

7. The device of claim 1, wherein at least one of said index of refraction and said extinction coefficient is graded along a thickness of said amorphous carbon layer.

8. The device of claim 1, wherein said index of refraction comprises a value ranging from 1.1 to 1.9.

9. The device of claim 1, wherein said amorphous carbon layer comprises at least one of chemical vapor deposition (CVD) coating, and plasma enhanced CVD coating.

10. The device of claim 1, wherein said amorphous carbon layer is configured to provide at least one of control of a critical dimension of said single damascene structure, and control of a critical dimension variation of said damascene structure.

11. The semiconductor device of claim 1, wherein said damascene structure is a single damascene structure.

12. The semiconductor device of claim 1, wherein said damascene structure is a dual damascene structure.

13. The semiconductor device of claim 1, wherein said film to be processed comprises a low-k dielectric layer.

14. The semiconductor device of claim 1, wherein said hard mask layer comprises a nitride.

15. The semiconductor device of claim 1, wherein said hard mask layer comprises at least one of silicon nitride ($Si_3N_4$), a refractory metal and refractory metal nitride such as tantalum nitride (TaN).

16. The semiconductor device of claim 1, wherein said hard mask layer comprises a carbide.

17. The semiconductor device of claim 1, wherein said hard mask layer comprises at least one of silicon carbide (SiC) or silicon oxycarbide (SiCO).

* * * * *